(12) United States Patent
Richart et al.

(10) Patent No.: US 11,082,059 B1
(45) Date of Patent: Aug. 3, 2021

(54) METHOD AND SYSTEM FOR OBTAINING AND STORING SENSOR DATA

(71) Applicant: Teraki GmbH, Berlin (DE)

(72) Inventors: Daniel Lampert Richart, Berlin (DE); Markus Kopf, Berlin (DE)

(73) Assignee: Teraki GmbH, Berlin (DE)

( * ) Notice: Subject to any disclaimer, the term of this patent is extended or adjusted under 35 U.S.C. 154(b) by 651 days.

(21) Appl. No.: 16/065,299

(22) PCT Filed: Dec. 30, 2015

(86) PCT No.: PCT/EP2015/081453
§ 371 (c)(1),
(2) Date: Jun. 22, 2018

(87) PCT Pub. No.: WO2017/114579
PCT Pub. Date: Jul. 6, 2017

(51) Int. Cl.
*H03M 7/30* (2006.01)
*G06K 9/28* (2006.01)

(52) U.S. Cl.
CPC ............ *H03M 7/3062* (2013.01); *G06K 9/28* (2013.01); *H03M 7/6058* (2013.01)

(58) Field of Classification Search
CPC ..... H03M 7/3062; H03M 7/6058; G06K 9/02
See application file for complete search history.

(56) References Cited

U.S. PATENT DOCUMENTS

| 8,693,597 B2 * | 4/2014 | Sexton ................. H03M 1/129 375/346 |
| 2011/0066381 A1 | 3/2011 | Garudadri et al. |
| 2014/0047106 A1 | 2/2014 | Leung et al. |

(Continued)

FOREIGN PATENT DOCUMENTS

EP 2369748 A1 9/2011

(Continued)

OTHER PUBLICATIONS

Communication pursuant to Article 94(3) EPC for Application No. 15820548.4 dated May 16, 2019, 4 pages.

(Continued)

*Primary Examiner* — Khai M Nguyen
(74) *Attorney, Agent, or Firm* — Fletcher Yoder P.C.

(57) ABSTRACT

A computer-executable method and system for querying sensor data of a plurality of sensors is provided. Sensor data is received that comprising sensor data values sampled by a first sensor of said plurality of sensors according to a first compressive sampling scheme. The first compressive sampling scheme can be applied by the first sensor within a sampling time window and the received sensor data corresponds to samples of a signal within the sampling time window. The sensor data is stored in a first database. A frequency decomposition of the signal is computed based on a sparsifying transform associated with the first compressive sampling scheme and the received sensor data. The frequency decomposition comprises one or more frequency components. The one or more frequency components are stored in a second database. A query is received from a client. The query specifies an event that indicates a critical signal condition of a signal. It is detected whether the event exists using the received sensor data or the one or more frequency components.

7 Claims, 6 Drawing Sheets

(56) References Cited

U.S. PATENT DOCUMENTS

2015/0178944 A1  6/2015  Haimi-Cohen et al.
2015/0334580 A1  11/2015  Niskanen et al.

OTHER PUBLICATIONS

Charbiwala et al; "Energy Efficient Sampling for Event Detection in Wireless Sensor Networks;" Proceedings of the 2009 ACM/IEEE international symposium on Low power electronics and design, San Francisco, pp. 419-424.
International Search Report for PCT/EP2015/081453 dated Aug. 23, 2016; 3 pages.
Masiero, R. et al.; "Data Acquisition through Joint Compressive Sensing and Principal Component Analysis," 2014 IEEE Global Communications Conference; Nov. 1, 2009; 6 pages.
Wang, Yanxue et al., "Compressed sparse time-frequency feature representation via compressive sensing and its applications in fault diagnosis," Measurement, vol. 68, May 1, 2015, 12 pages.
Communication pursuant to Article 94(3) EPC for Application No. 15817430.0 dated Apr. 29, 2021, 7 pages.

\* cited by examiner

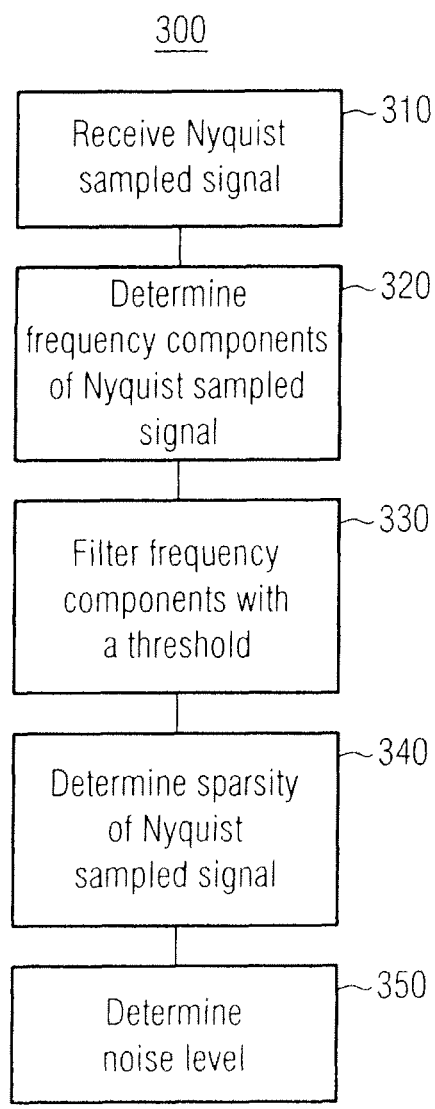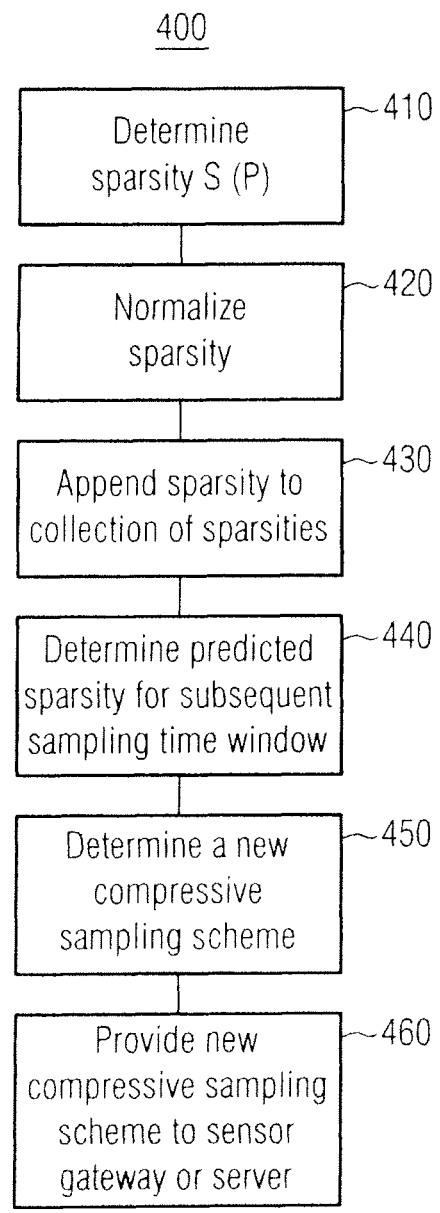
FIG. 3
FIG. 4

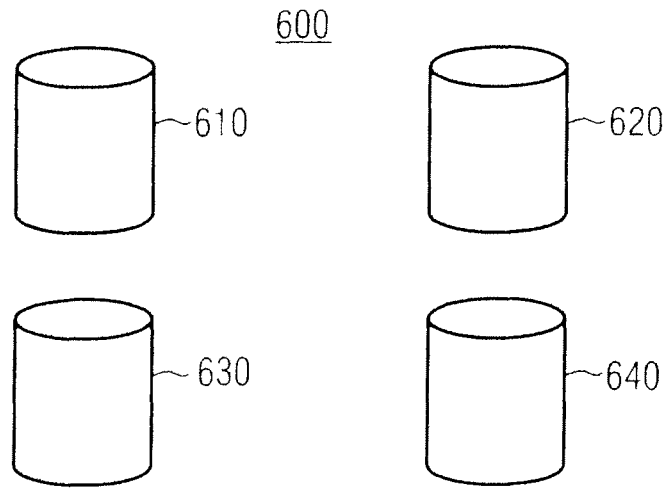
FIG.6
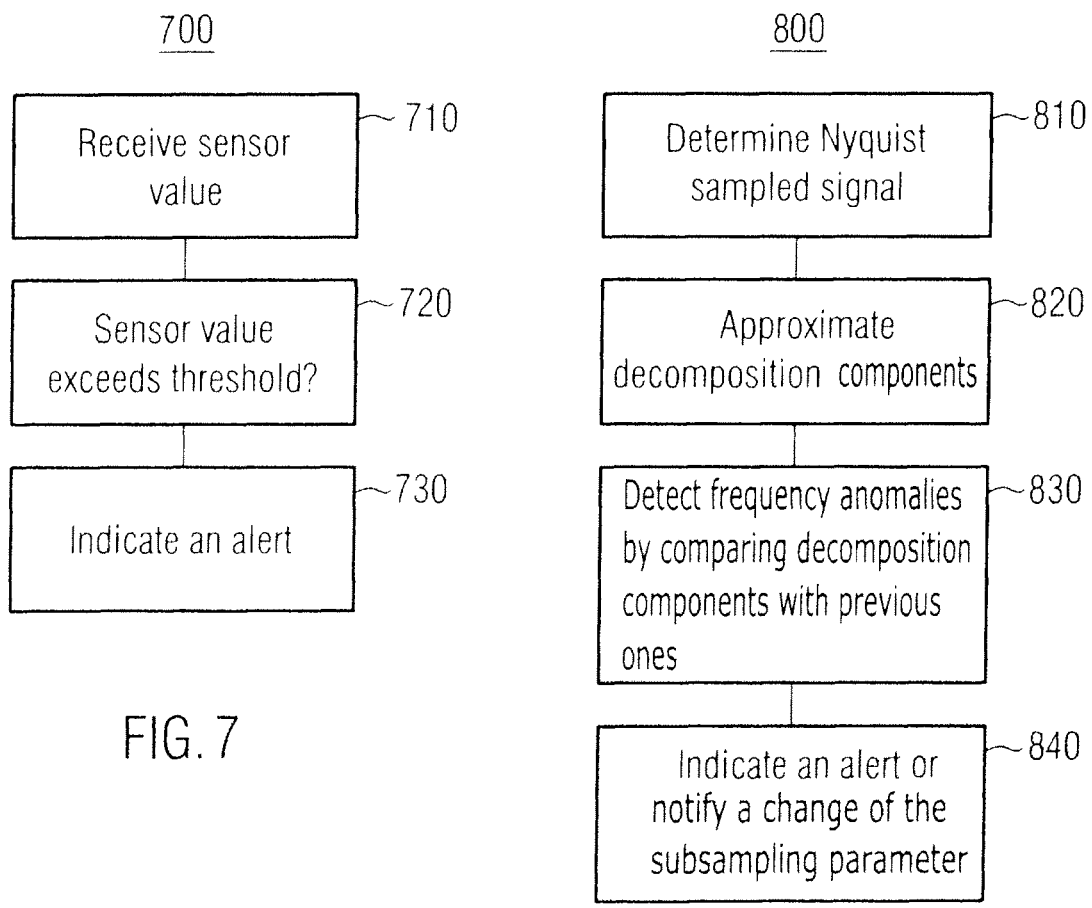
FIG.7
FIG.8

METHOD AND SYSTEM FOR OBTAINING AND STORING SENSOR DATA

CROSS-REFERENCE TO RELATED APPLICATIONS

This application is a national stage of PCT Application No. PCT/EP2015/081453, entitled "METHOD AND SYSTEM FOR OBTAINING AND STORING SENSOR DATA", filed on Dec. 30, 2015, which is hereby incorporated by reference in its entirety.

BACKGROUND

The present invention relates to the sampling of signals by a plurality of sensors and the respective transmission of the sampled data to a gateway or to one or more servers or cloud services. The efficient transmission and processing of such sampled data in a remote network or cloud service becomes increasingly critical with the increase of sensor data to be sampled or processed. For example, smart cities operate large sensor networks which enable the users to benefit from a variety of smart applications based on environment data and large amounts of data that is sensed and processed. Likewise, production facilities often utilize large sensor networks as in machine to machine (M2M) applications and generate numerous real-time sensor data for monitoring, e.g., a production chain. All kinds of vehicles, such as watercraft, aircraft or road vehicles are also provided with more and more sensors, thus creating a need to appropriately acquire and analyze the sensor data and further on efficiently transmit it to a server where it is to be analyzed.

The generation of the vast amount of data comes with a need for efficient transmission, processing, analyzing and storing of the sensor data. Today's sensor networks produce high network traffic both at a data transmitting sensor and a corresponding receiver. These requirements impose physical limits to the size, density, availability and latency characteristics of any sensor network. Likewise, the known sensor networks waste valuable network resources by transmitting redundant sensor data which will be compressed in a subsequent processing step. Conventional compression methods come with a high cost of resource consumption when compressing sensor data either before transmission or after a reception at a cloud storage or gateway. Furthermore, conventional compression methods add an additional delay into the processing chain of the sensor data which impedes time critical applications. In addition, these compression methods lock away the valuable sensor data in a manner complicating advanced data analysis or simple queries, since the compressed data conceals the otherwise meaningful information apparent in the uncompressed sensor data.

Additionally, the compression ratio of traditional compression methods improves with a larger amount of data, since more statistical redundancies may be identified from a larger set of data. For this reason, traditional compression methods may be inappropriate for smaller sets of data.

While the compressive sampling framework (also known as compressed sensing, compressive sensing, sparse sampling) provides valuable approaches to overcome the drawbacks of conventional compression methods, it also imposes new difficulties in the application of sensor networks, specifically the data transmission, data reconstruction and data analysis.

Among those drawbacks may be the need of applying a sparsifying transformation of the signal at a gateway device, further manipulating the values of the single data points into a suited compressed data format. Such steps hinder achieving a more efficient use of existing bandwidth, as the compressive sampled signals may not be merged with each other. Further, it still drains necessary computational and memory resources in the gateway and sensor devices. An additional drawback exists in that no information about the underlying decomposition structure of the signals may be derived at the gateway, thus hindering advanced analytics at the gateway.

Further on, the storage formatting of compressive sensing reduced data is not adapted to the architecture of most actual databases, what makes data access and analytics applications more cumbersome to achieve, as they depend on reconstructing the data back to a Nyquist sampling format.

SUMMARY

An embodiment of the present invention provides a computer-executable method for querying sensor data of a plurality of sensors. The exemplary method comprises a step of receiving sensor data that comprises sensor data values sampled by a first sensor of the plurality of sensors according to a first compressive sampling scheme. The first compressive sampling scheme is applied by the first sensor within a sampling time window and the received sensor data correspond to samples of a signal within the sampling time window. The method further comprises a step of storing the sensor data in a first database and a step of computing a frequency decomposition of the signal. The computation of the frequency decomposition can be based on a sparsifying transform associated with the first compressive sampling scheme and the received sensor data, wherein the frequency decomposition comprises one or more frequency components. The method further comprises a step of storing the one or more frequency components in a second database. According to the embodiment, a query can be received from a client. The query can specify an event that indicates a critical signal condition of a signal. The method may then detect whether the event exists using the received sensor data or the one or more frequency components.

According to a further embodiment is the event associated with at least one given threshold value and the at least one given threshold value relates to at least one of the stored sensor data values in the first database. The event is then detected, if at least one of the stored sensor data values in the first database exceeds the at least one given threshold value.

According to a further embodiment is the event is further associated with a portion of a given frequency decomposition. The given frequency decomposition can be further associated with the sparsifying transform. The portion of the given frequency decomposition can define a frequency pattern for identifying the event and the portion of the given frequency decomposition includes one or more frequency components. An exemplary method can compare the portion of the given frequency decomposition with the computed one or more frequency components of the frequency decomposition. The event is then detected, if the portion of the given frequency decomposition matches to a portion of the stored frequency components of the signal.

According to a further embodiment comprises the query a request for a reconstruction of the signal within the entire sampling time window. The method can comprises the step of, in response to the request, reconstructing the signal over the entire sampling time window. The reconstructing step thereby comprises a step of determining the sparsity transform associated with the first compressive sampling scheme applied by the first sensor within the sampling time window for the received sensor data, wherein the sparsity transform is stored in a third database. The method may further comprise a step of determining the frequency decomposition of the signal, wherein said determining further comprises retrieving the one or more frequency components of the frequency decomposition in the second database. The method further comprises a step of computing the reconstructed signal signal by a multiplication of the determined sparsifying transform with the frequency decomposition of the signal, wherein said multiplication is performed according to a matrix-vector-multiplication. The method further comprises returning the reconstructed signal to the client.

According to a further embodiment comprises the method a step of receiving Nyquist sampled sensor data from the first sensor, wherein the Nyquist sampled sensor data comprises sensor data values sampled by the first sensor according to a Nyquist sampling scheme. The method further comprises a determining of a classification of the Nyquist sampled sensor data. The determining the classification may comprise the step of decomposing the Nyquist sampled sensor data into a second frequency decomposition. The second frequency decomposition is thereby associated with the sparsifying transform and comprises one or more frequency components. The method further comprises determining a first given threshold value that is associated with a first classification from among a plurality of classifications. The exemplary method further comprises a comparing of each frequency component from the second frequency decomposition with the first given threshold value. If at least one of the frequency components of the second frequency decomposition exceeds the first given threshold value, the method determines the Nyquist sampled sensor data corresponding to the first classification. The method further comprises a step of associating the received sensor data of the first sensor with the determined classification of the Nyquist sampled sensor data. The method further comprises the step of storing the received sensor data of the first sensor together with additional sensor data in the first database, wherein the additional sensor data is associated with the first classification. According to this embodiment comprises the step of detecting whether the event exists the step of detecting the event based on the associated classification in the first database.

According to a further embodiment, the method further comprises a step of receiving sensor data being sampled according to a second compressive sampling scheme by a second sensor from said plurality of sensors. The sampling time window of the first compressive sampling scheme can be common to the sampling time window of the second compressive sampling. Each compressive sampling scheme can comprise one or more indices, where each index defines a corresponding sampling time instant within a compressive sampling time window. Each defined sampling time instant of the first compressive sampling scheme can be different to each defined sampling time instant of the second compressive sampling scheme. The method can further store the sensor data of the second sensor along with the stored sensor data of the first sensor in the first database. The detecting whether the event exists can further comprise a step of detecting the event using the sensor data of the second sensor in the first database.

According to a further embodiment is a system for querying sensor data of a plurality of sensors provided. The sensor data comprises sensor data values sampled by a first sensor of said plurality of sensors according to a first compressive sampling scheme. The first compressive sampling scheme can be applied by the first sensor within a sampling time window and the received sensor data corresponds to samples of a signal within the sampling time window. The system is adapted to perform any of the above summarizes methods and the method as described below in more details.

BRIEF SUMMARY OF THE FIGURES

These and further aspects and features of the present invention will be described by the following detailed description of the embodiments of the invention under reference to the accompanying drawings, wherein

FIG. 3 illustrates a sparsity determination routine;

FIG. 4 illustrates a sensing adaption routine;

FIG. 6 illustrates a database system 600 for managing sensor values;

FIG. 7 illustrates a routine for determining a critical signal condition base on a threshold; and FIG. 8 illustrates a routine for determining a critical signal condition based on a frequency decomposition.

DETAILED DESCRIPTION

Figure 1:
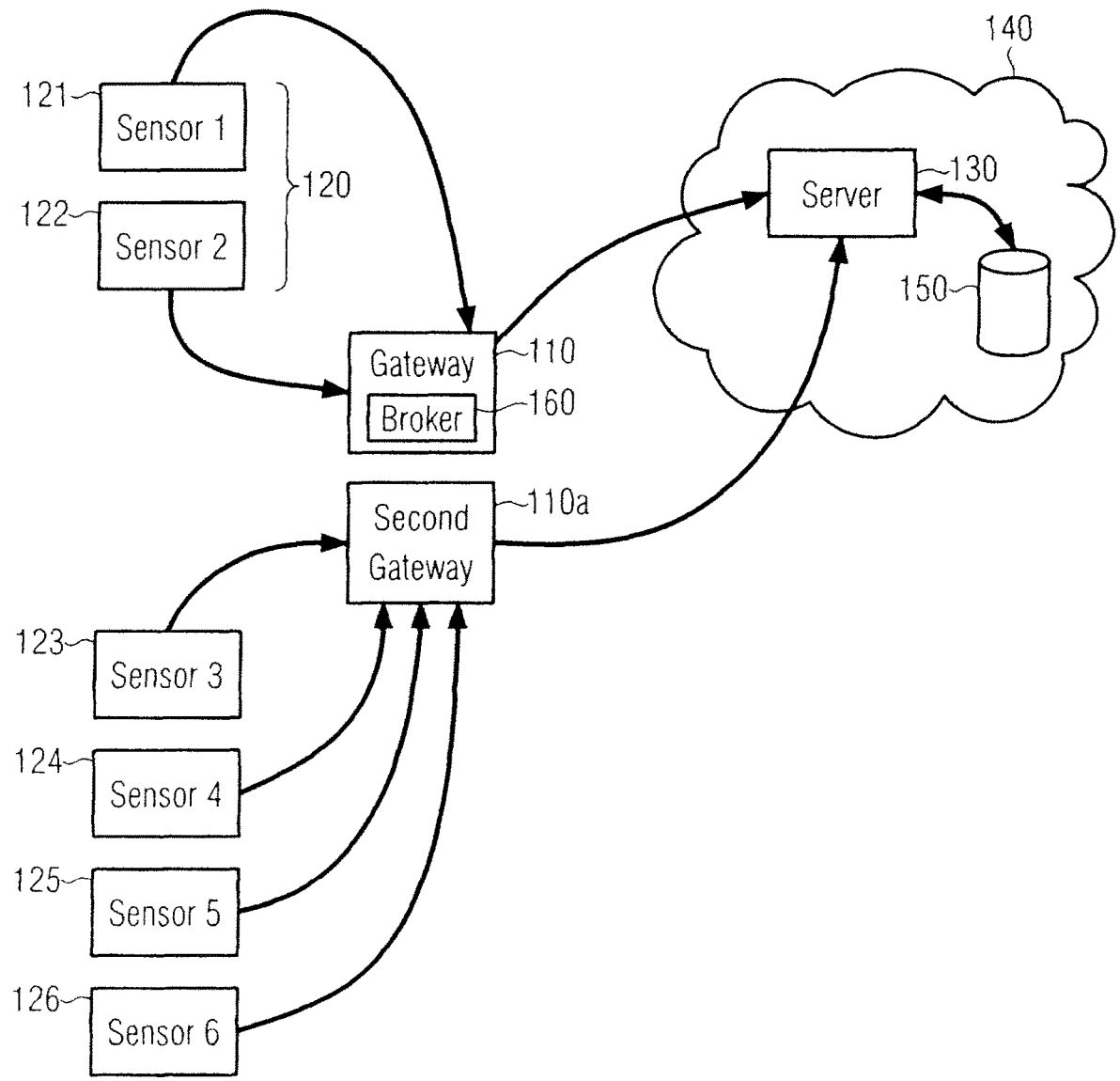
FIG. 1 illustrates a system.

Reference will now be made in detail to the exemplary embodiments, examples of which are illustrated in the accompanying drawings, wherein like reference numerals refer to like elements throughout.

With the term sparsity, an intrinsic property of a signal may be denoted, wherein the sparsity may express the number of nonzero coefficients when said signal is represented in a sparsity basis or sparsifying transform. If the sparsity of a signal is expressed as a number k corresponding to the number of nonzero coefficients of the signal, then one may say that the signal is sparser as the number k decreases.

FIG. 1 illustrates a system 100 according to an embodiment. The system 100 may comprise a gateway 110 and/or a second gateway 110a, one or more sensors 120, including sensors 121 to 126, a server 130, a cloud environment 140, one or more databases 150, and a message broker 160. The message broker 160 may be part of or running on the gateway 110, the server 130 or the cloud environment 140. Likewise, the message broker 160 may be a proper instance of its own outside any of the previously mentioned components.

The sensor 121 may sample a signal accessible to said sensor 121 and may receive a sensor value corresponding to a point in time when the signal was sampled. The Nyquist—Shannon sampling theorem defines a sufficient condition of how to sample a continuous-time signal with finite bandwidth, while maintaining the ability to perfectly reconstruct the continuous-time signal from the sampled data. This condition may be fulfilled if the continuous-time signal is sampled with a sampling rate corresponding to at least more than twice the Nyquist frequency of the signal. Such kind of sampling may also be denoted as a Nyquist sampling scheme. In practice, the sampling rate may be limited by the maximum sampling rate of the ADC used in a sensor. Such a Nyquist sampling scheme may be specified by its sampling rate R and a sampling duration T, wherein T may denote the duration of how long sensor values may be acquired. As such, T may also define the length of a sampling time window. N, the number of acquired sensor values during the Nyquist sampling scheme, may be determined by R times T. The set of N sensor values acquired from this Nyquist sampling scheme may also be denoted as the Nyquist sampled signal. In this example, the signal at the sensor may be perfectly determined from the set of N sensor values, or shortly from the Nyquist sampled signal (with length/size N).

In the recent past new sampling techniques have emerged which may allow perfect reconstruction of a signal at a sensor 121 from fewer sensor values than acquired during a corresponding Nyquist sampling scheme. The compressive sampling framework (also known as compressed sampling, compressed sensing, compressive sensing, or sparse sampling) defines a novel sampling approach for efficiently acquiring sensor values and reconstructing a signal at a sensor from the fewer sensor values. A signal at a sensor may be undersampled according to the compressive sampling framework when the signal is sparse in a corresponding sparsity basis, wherein the undersampling denotes that fewer sensor values may be acquired than in a comparable Nyquist sampling scheme. The compressive sampling framework may be divided into 2 parts, a $1^{st}$ part concerning the data acquisition, and a $2^{nd}$ part concerning the reconstruction of the signal from the reduced number of sensor values. Turning to the $1^{st}$ part, the data acquisition, it may suffice to provide a compressive sampling scheme to the sensor for enabling a sensor 121 to undersample a signal. The compressive sampling scheme may define a set of time instants within a sampling time window, wherein each of the time instants may define when to acquire a sensor value from the sensor, respectively. In a corresponding Nyquist sampling scheme, the sampling time window would have consisted of N (sampling) time instants separated by a fixed delay from each other. However, in the compressive sampling scheme, the number of time instants M within the same sampling time window may be lower than in the corresponding Nyquist sampling scheme. M may also be denoted as the subsampling parameter. A gateway 110 or a server 130 may determine the compressive sampling scheme for the sensor 121, and may also determine or select the set of M time instants from the total number of N time instants within the sampling time window. The set of M time instants for the compressive sampling scheme may be determined or selected randomly. The set of M time instants may be chosen according to a well known method conforming to the requirements of the compressive sampling theory. This may be implemented by multiplying the input signal with a subsampling matrix. This matrix may be generated in the gateway 110 or in the server 130. Further, the subsampling should satisfy the RIP (Restricted Isometry Property) condition, which may be fulfilled in the generalized case that the subsampling matrix is a randomized matrix, e.g. constructed by a random permutation of the columns of the original matrix. Alternatively, the sensor values may be directly retrieved at the randomly chosen points of time. If the sensor 121 samples the signal according to the compressive sampling scheme, the sensor may generate M sensor values. The set of M sensor values generated from the compressive sampling scheme may also be denoted as the compressively sampled signal (or reduced sampled signal or sub-Nyquist sampled signal or compressive measurements or reduced measurements or sub-Nyquist sampled data). Each sensor value from the compressively sampled signal may correspond to a particular time instant defined in the compressive sampling scheme.

Now turning to the second part of the compressive sampling framework, the reconstruction of the signal, in the example above, the signal at the sensor 121 may be reconstructed or approximated from the compressively sampled signal. Greedy reconstruction methods based on the Lasso minimization problem may be used for reconstructing the signal. A reconstructed signal is equi valent to a signal sampled according to a Nyquist sampling scheme. A measurement matrix may be constructed from the specific compressive sampling scheme (which was used for generating the compressively sampled signal) and a sparsifying transform (in which the signal shall be reconstructed). The sparsifying transform may be a sparsity basis or a dictionary. The dictionary may be obtained from a dictionary learning algorithm. Among those dictionary learning algorithms decomposition are methods based on the Compressive-Projection Principal Component Analysis (in the following abbreviated as CPPCA). The dictionary may be an optimized sparsifying transform for representing the reconstructed signal with very few coefficients.

A compressive sampling scheme may be generated based on its subsampling parameter M. The compressive sampling scheme may define a set of M time instants within a sampling time window, wherein said sampling time window would correspond to a sampling time window with N sampling time instants in a Nyquist sampling scheme. The set of M time instants may be defined/determined by randomly selecting M indices from 1 to N. This randomization model may be based on a uniform, normal, lognormal or negative exponential distribution of the indices. By multiplying the set of M selected indices with a time unit corresponding to a common sampling rate, such as that of a corresponding Nyquist sampling scheme, each selected index from the M selected indices may be expressed as a relative delay or relative time instant, which may define when to acquire a sensor value within a sampling time window. A sensor 121 may further use its compressive sampling scheme as a transmission scheme. In other words, the sensor 121 may not wait until all sensor values for a specific sampling time window have been acquired before starting their transmission. Quite to the contrary, the sensor 121 may directly transmit each acquired sensor value as the sensor value is acquired. This approach of sampling and direct transmission may be used in either case of the sampling schemes, i.e. Nyquist sampling scheme or compressive sampling scheme. In the case of the Nyquist sampling scheme, at each of the sampling time instants of a corresponding sampling time window, the sensor would send a sensor value. In the case of the compressive sampling scheme, at each sampling time instant of the corresponding sampling time window, the sensor may or may not send a sensor value. By using the direct transmission approach, the latency between acquiring a sensor value and receiving said sensor value may be reduced. It is also conceivable that the sensor 121 may use a batch mode transmission scheme for the sensor values. This transmission scheme may also be used in either sampling schemes. In the batch mode transmission scheme, the sensor 121 may wait until all sensor values of a specific sampling time window have been acquired and then send the sensor values. In a Nyquist sampling scheme, the sensor 121 may send N sensor values in a batch or as soon as they are acquired. In a compressive sampling scheme, the sensor 121 may send M sensor values in a batch. The gateway 110, the server 130 or the broker 160 may receive the sensor values sent by the sensor 121. Sensor values with optionally metadata may be streamed as data streams or data streaming signals. Data streaming signals generated or acquired at a sensor 121 may be transmitted to the gateway 110 or server 130 by using low range data transmission layers based on the IEEE802.15.4 standardized physical communication layers such as 6LowPan, Zigbee, Wifi, Bluetooth and compatible. A transmission of data from the gateway 110 and/or sensor 121 may be achieved by using standardized cellular network protocols (LTE, LTE-M, UMTS, CDMA, GSM) and further UNB transmission technology based protocols such as Sigfox. Whenever data is transmitted in batches, communication protocols such as HTTP and UDP may be used between the gateway 110 and server 130. Packet transmission may be improved by lightweight communication standards such as MQTT and CoAP. Thus, the various transmission possibilities are not limited to the application of a specific transmission protocol. MQTT may provide an increased time resolution, respectively reduced latency for querying single sensor values of a compressively sampled signal.

In a system 100 with multiple sensors 121 to 126, sensor values from each sensor may be received simultaneously. In other words, one or more sensors may simultaneously transmit their respective sensor values in a common sampling time window. Further, it may be considered using a time multiplexing transmission scheme for the sensors based on their compressive sampling schemes. As it is known from the compressive sampling framework, many signals in the environment may have an intrinsic sparsity and this sparsity may be exploited to define a multiplexed compressive sampling scheme for multiple sensors. For example, there may be four sparse signals with a similar degree of sparsity, and each sparse signal may be measured by one of the sensors 121 to 124, respectively. In a Nyquist sampling scheme, it may suffice to measure each of said sparse signals with N sensor values. In other words, one may acquire a corresponding Nyquist sampled signal with N sensor values for each sparse signal. Accordingly, the transmission of the 4 Nyquist sampled signals with N sensor values may set requirements to the bandwidth when attempting to simultaneously receive the 4 signals. Further on, it may be desirable to send the respective data points as soon as they are acquired instead of using a batch transmission in order to reduce analysis latency. Following this example with 4 sensors, each sparse signal may have such an intrinsic sparsity that it may suffice to undersample each sparse signal with a subsampling parameter $M \leq N/4$ at each sensor 121 to 124 (wherein M may be chosen much smaller than N/4 in order to ensure a close to uniform random distribution of the subsampled point of each signal). Thus, each sensor 121 to 124 may simultaneously acquire its sensor values of its sparse signal according to its compressive sampling scheme (which defines a reduced number of sampling instants). Each of these compressive sampling schemes may be based on a common sampling time window of the four sensors 121 to 124. Further, each compressive sampling scheme may define a set of $M \leq N/4$ time instants within said common sampling time window. Since each compressive sampling scheme of each sensor 121 to 124 may define fewer than the maximum number of (sampling) time instants N, each compressive sampling scheme may have sampling gaps or voids, which may correspond to time instants at which the sensor associated to the compressive sampling scheme may not acquire a sensor value. Each of the compressive sampling schemes may be generated in such a way that each defined (sampling) time instant in the first compressive sampling scheme, may coincide with a common sampling gap/void of the other compressive sampling schemes. The same may hold true for each defined (sampling) time instant of the other compressive sampling schemes. In other words, the compressive sampling schemes of the multiplexing sensors may be generated such that each defined (sampling) time instant of the compressive sampling schemes complements the other in a common sampling time window. The idea of time multiplexing multiple sensors may not be limited to 4 sensors, but can be extended to any two or more sensors, respectively compressive sampling schemes. Following the example with 4 sensors, each of the four sensors 121 to 124 may send its sparse signal as a compressively sampled signal with less than N/4 sensor values, such that the bandwidth requirements of a receiver receiving the 4 sparse signals may be relaxed such that they may correspond to the requirement for receiving only one Nyquist sampled signal.

Likewise, in an example of two sensors sharing a common sampling time window (of size N), the two multiplexing compressive sampling schemes must not be of the same size, meaning that they must not be based on the identical value of a subsampling parameter M. For example, the subsampling parameter for the first sensor (respectively the first compressive sampling scheme) may be N/4 and the subsampling parameter of the second sensor may be 3 times N/4. In this case, it may be assumed that the signal of the first sensor may be sparser than the signal of the second sensor.

Additionally, when using the direct transmission scheme as described above, the time multiplexing compressive sampling scheme may lead to a further increase of reception capabilities at a corresponding receiver of the sensor values sent by the sensor. In particular, if, for example, the gateway 110, the server 130 or the message broker 160 would receive one Nyquist sampled signal within a sampling time window, then, by using the time multiplexing compressive sampling schemes, the receiver (here substituted for the gateway 110, server 130 or message broker 160) may receive multiple compressively sampled signals within the same (common) sampling time window. The multiplexed sensor values may be demultiplexed, that is, each received sensor value may be associated with the corresponding sensor and/or compressive sampling schemes. The receiver 110, 130 or 160 may perform the demultiplexing based on each of the compressive sampling schemes associated with each sensor of the multiple sensors. Likewise, each received sensor value may have been supplemented with an identifier associated with the respective sensor. As such, the compressive sampling schemes may be reconstructed based on the received sensor values, the identifier and an inspection of the arrival times of each sensor value, as the arrival times of each sensor value may correspond to the (sampling) time instants defined in each compressive sampling scheme. It is also contemplated, that each compressive sampling scheme associated with each sensor may be provided and/or generated by the server 130.

According to an embodiment, the gateway 110 or message broker 160 may buffer received sensor values of a sampled signal until enough sensor values are received for completing a batch. They may then transmit the sensor values in a batch transmission to the server 130.

Each compressively sampled signal from a sensor 121 may be processed independently of other Nyquist or compressively sampled signals. According to an embodiment, the parameters for operating a sensor 121 in a compressive sampling manner may be (dynamically) adapted. For example, a decrease in sparsity of a signal may require increasing a subsampling parameter M of the corresponding compressive sampling scheme used for sensing the signal. Likewise, a drop in noise level on the signal may increase a corresponding signal-to-noise ratio of the signal. In this case, the sparsity of the signal may decrease which could allow using a decreased subsampling parameter M for the corresponding compressive sampling scheme. Accordingly, a decreased signal-to-noise ratio of the signal may result in a lower sparsity of the signal which may require increasing the subsampling parameter M of the compressive sampling scheme. It is even contemplated adapting or optimizing a sparsifying transform associated with the compressive sampling scheme. For the motives outlined above, a sensing adaption routine may be used, which may enable an adapting of the subsampling parameter M, the compressive sampling scheme itself, or a sparsifying transform associated with the compressive sampling scheme.

Figure 2A:
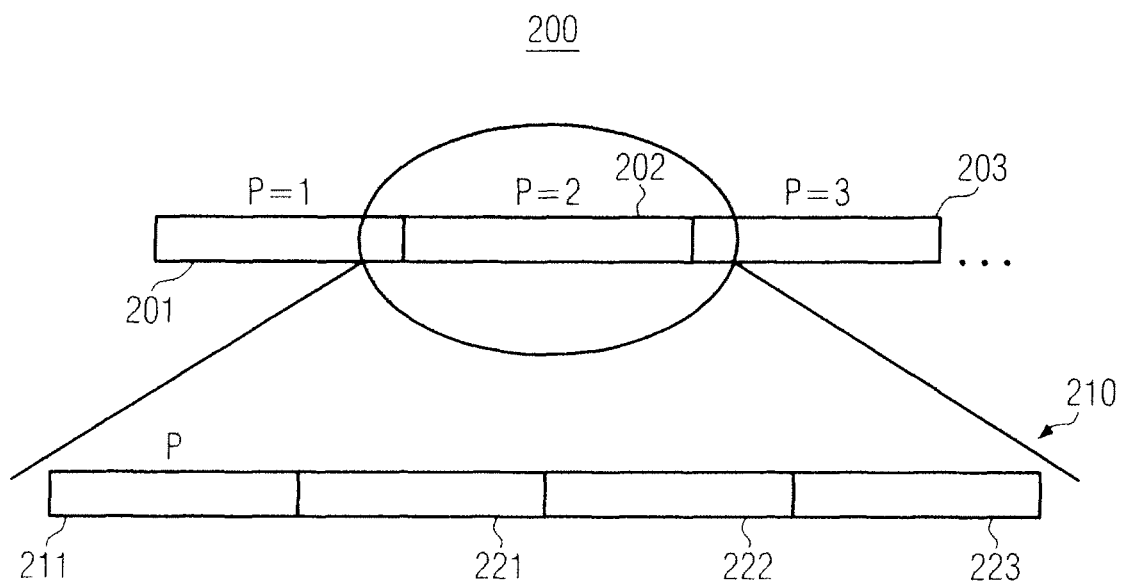
FIG. 2A illustrates an alternating sensing scheme.

According to an embodiment, an alternating sensing scheme may be optionally employed by a sensor 121, which is explained in more detail with FIG. 2A. In FIG. 2A, a Nyquist sampling time window 211 with one or more successive compressive sampling time windows 221 to 223 is illustrated. Further, it is contemplated that a sensor 121 may be acquiring and transmitting its sensor values according to a Nyquist sampling scheme during the Nyquist sampling time window 211, and likewise may be acquiring and transmitting its sensor values according to a compressive sampling scheme during a compressive sampling time window 221. The sensor 121 may be operated according to this alternating sensing scheme, which may comprise a Nyquist sampling time window 211 at the beginning of the alternating sensing scheme 202 and one or more compressive sampling time windows 221 to 223. A further division may apply on the Nyquist sampling windows into a sub-sampling and a sparsifying transform adaptation period. Both of them are interleaved with an adaptive filtering adaptive procedure. The server 130 or gateway 110 may provide the sensor 121 with an alternating sensing scheme. Likewise, they may operate or request the sensor 121 to change the Nyquist or compressive sampling schemes. According to an embodiment, they may adapt the length of the sampling time window (in either sampling schemes). Likewise, they may adapt the ratio of Nyquist sampling time windows to compressive sampling time windows. That is to say, they may adapt for each alternating sensing scheme 301 how many compressive sampling time windows may follow after the Nyquist sampling time window at the beginning of the alternating sensing scheme. These steps may be performed prior to runtime during a learning phase. Each alternating sensing scheme may be identified by an identifier P, wherein the identifier P may also identify a corresponding sampling interval. Likewise, each Nyquist sampling time window may be identified by another identifier p. For example, a $1^{st}$ alternating sensing scheme 201 may include a $1^{st}$ Nyquist sampling time window and a $1^{st}$ compressive sampling time window. After receiving the sensor values sent by a sensor 121, it may be determined (by the server 130 or gateway 110) that for the next sampling interval P+1 another alternating sensing scheme may be used. Therefore, the server 130 or gateway 110 may provide a new alternating sensing scheme 202 to the sensor 121, which may comprise three compressive sampling time windows 21 to 223 instead of just one as in the previous alternating sensing scheme 201. They may even determine or specify which compressive sampling scheme to use at each specific compressive sampling time window 221 to 223. According to an embodiment, a sensor 121 may be repeatedly using a $1^{st}$ alternating sensing scheme until directed or requested to use another alternating sensing scheme. Likewise, the sensor 121 may be requested or directed to use another compressive sampling scheme or Nyquist sampling scheme. According to an embodiment, the alternating sensing scheme may be combined with multiplexing compressive sampling schemes. According to an embodiment, the alternating sensing scheme may also be combined with a batch mode transmission scheme. For example, a sampling interval corresponding to an alternating sensing scheme 201 may be divided into one Nyquist sampling time window and 9 compressive sampling time windows. At the end of each compressive sampling time window, a batch with M sensor values (corresponding to a compressively sampled signal) may be received by the gateway 110 or server 130. Accordingly, a Nyquist sampled signal with N sensor values may also be received in a batch. In general, based on a received Nyquist sampled signal, a new subsampling parameter M and/or a new sparsifying transform may be determined for the next sampling interval, respectively compressive sampling time window.

Figure 2B:
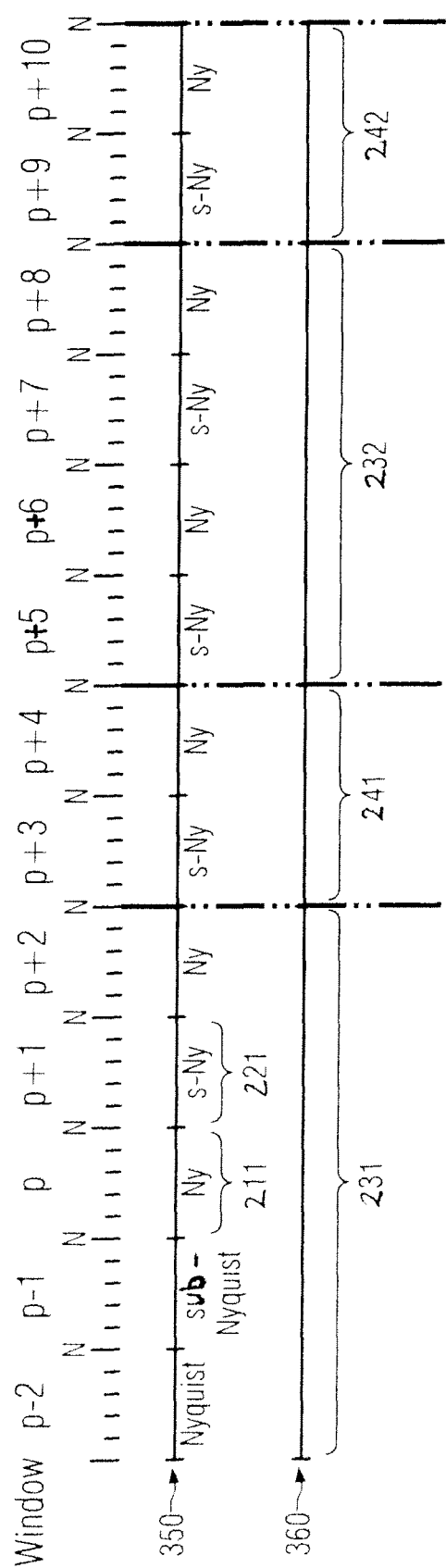
FIG. 2B illustrates a time diagram for adaptation schemes.

FIG. 2B illustrates a time diagram for adaptation schemes. A timeline 250 for the sampling periods illustrates an exemplary sampling pattern for a sensor 121. For example, the sensor 121 may alternate between Nyquist sampling period 211 and a sub-Nyquist sampling period 221. Each sampling period may have a size of N sampling time instants. A parallel timeline 260 illustrates corresponding time intervals at the gateway 110 or server 130. During a subsampling adaption window 231, which may overlap with sampling time windows (p−2) to (p+2), a subsampling adaptation scheme may be performed at the server 130 or gateway 110. The same may hold true for subsampling adaption window 232, which may overlap with the sampling time windows (p+5) to (p+8). During a sparsifying transform adaption window 241 or 242 a sparsifying transform adaptation scheme may be performed at the server 130 or gateway 110. As such, the sparsifying transform adaptation scheme and subsampling adaptation scheme may be performed in an alternating manner. The dynamics of the signals acquired at the initialization of the routine being sampled at the sensor 121 may determine a proportion or ratio between the sampling periods which may be used performing the subsampling adaption process and the sparsifying transform adaption process. The ratio may be given by (number of sampling periods during subsampling adaption process)/(number of sampling periods during sparsifying transform adaption process).

FIG. 3 illustrates a sparsity determination routine 300 for determining a sparsity of a Nyquist sampled signal. In a step 310, a Nyquist sampled signal from a sensor 121 may be determined. For example, the Nyquist sampled signal with N sensor values may be received at the gateway 110 or server 130. The Nyquist sampled signal may be associated with a sampling time window p.

In step 320, frequency components of the Nyquist sampled signal may be determined. Said frequency components may be determined by multiplying the Nyquist sampled signal with a sparsifying transform. The sparsifying transform may be associated with a compressive sampling scheme associated with the sensor 121. Possible sparsifying transforms may be defined by the DCT, Fourier, Gabor, Haar or Hadamard basis, PCA (Principal Component Analysis) or a dictionary. Independent of step 320, the sparsifying transform may be synchronized between the gateway 110, server 130, cloud environment 140 or databases 150. This synchronization may be embedded in the scheme described before, with a CPPCA comprised of a lightweight principal component coefficient determination scheme in the gateway and a PC approximation scheme in the server. Further, it is contemplated that the sparsifying transform may be defined by a pre-shared model between the 2 entities (such as the gateway 110 and server 130), such that the sparsifying transform may be synchronized by exchanging model parameters between the 2 entities. The pre-shared model may be based on a dictionary based model, with well determined dictionary coefficients to be optimized during the dictionary learning scheme, such as used in the CPPCA scheme more generalized wavelet-type models (frame theory). This model approach of the sparsifying transform may reduce data traffic in comparison to a synchronization routine based on a full transmission of a matrix, which may be used to define a sparsifying transform.

In step 330, the determined frequency components may be filtered with a threshold C. Each of the determined frequency components may be compared with the threshold C. For example, the absolute value of each frequency component may be compared with the threshold C. The threshold C may be obtained or determined from a user, an initialization routine, or ultimately actualized by the adaptive learning scheme.

In step 340, the sparsity of the Nyquist sampled signal may be determined, for example, by counting the amount of remaining frequency components. Said amount of remaining frequency components may correspond to the sparsity of the Nyquist sampled signal at the corresponding sampling time window p.

In an additional step 350, the remaining frequency components may be used to synthesize a noise-free/noise-reduced signal, which may be further used to determine a noise level or signal-to-noise-ratio of the Nyquist sampled signal. The synthesis of the noise-free/reduced signal may be performed by a multiplication of the corresponding sparsifying transform with the remaining frequency components. These denoising features may be further combined with denoising schemes of the PCs (principal components) determined through PCA based construction of the sparsifying transform when using the sparsification adaptation scheme. In such multiplication, spots corresponding to the rejected frequency components may be set to zero. Alternatively, components of the sparsifying transform corresponding to the rejected frequency components may be ignored. Further on, denoising schemes may be deployed on the PCs themselves. The noise level of the Nyquist sampled signal may also be based on a pre-determined noise frequency spectrum for the sensor 121. For example, when initializing operation of the sensor 121, a background noise signal may be determined or a RMS value for noise amplitude may be measured. The computed RMS value of the noise may be further included in the adaptive filtering scheme as an additional parameter and may be actualized and predicted for each new time window.

FIG. 4 illustrates the sensing adaption routine 400, from which a new subsampling parameter M, a new sparsifying transform or predefined frequency decomposition may be determined. It may start with a specific time window p. The sensing adaption routine 400 may be performed by the gateway 110, the server 130 or the cloud environment 140. The sensing adaption routine 400 may be performed in order to adapt a compressive sampling scheme associated with a sensor 121 for a subsequent sampling time window (p+1). The learning scheme may run until the deviation between the predicted and the real sparsity determined during the Nyquist sampling periods does not vary above a typical RMS value between subsequent steps.

In step 410, a sparsity S associated with a sampling time window p may be determined. The sparsity S may be determined by performing the sparsity determination routine 300 outlined above. Likewise, the sparsity S may be provided by another entity, such as the gateway 110, the server 130 or the cloud environment 140.

In step 420, the sparsity S may be normalized to the number of sensor values N of a corresponding Nyquist sampled time window. In the following, the (normalized) sparsity associated with a specific sampling time window p is denoted by S(p). The (normalized) sparsity of the previous sampling time window may be denoted as S(p−1), and accordingly a subsequent (normalized) sparsity may be denoted as S (p+1).

In step 430, the determined sparsity S, which is associated with the sampling time window p, may be appended or added to a collection of previously determined (normalized) sparsities. Said collection may be regarded as a time series of the (normalized) sparsity at different sampling time windows. Said collection may be represented as a list, a table or a vector (wherein an index of a component of the vector may be associated to a corresponding sampling time window).

In step 440, a (normalized) sparsity for the subsequent sampling time window p+1 may be predicted. The predicted (normalized) sparsity may be determined as the (normalized) sparsity S(p). Likewise, it is contemplated that the predicted (normalized) sparsity may be determined as the moving average of the (normalized) sparsity from the sampling time windows (p−m) to p, wherein m may be a predefined value defining a width of the moving average. According to an embodiment, the predicted (normalized) sparsity may be determined from a filter. For example, the predicted (normalized) sparsity may be determined from a Wiener filter based on the collection of previously determined (normalized) sparsities. Likewise, said prediction may be performed with Kalman filter. Likewise, said prediction may be based on an adaptive filtering scheme, wherein the adaptive filtering scheme is based on a set of filter weights and the collection of previously determined (normalized) sparsities. When the gateway is performing the sensing adaption routine 400, the collection of (normalized) sparsities may be synchronized with the server 130. The synchronization may be performed so as to prepare the server 130 to perform the routine 400, if one may need to switch from the gateway 110 to the server 130.

In order to reduce the data transmission overhead between the gateway or server which may be required to synchronize the respective adaptive filtering models with each other, the scheme may be complemented with a threshold based synchronization: When the updated sparsity does not exceed a specific threshold, (for example, the threshold may correspond to the average of the previously determined sparsities+/−the sparsity RMS) the sparsity may not be transmitted to the server 130. The server 130 may register the lack of this transmission and the new sparsity may be determined based on the modeling parameters already stored at the server 130. In a scenario where the Nyquist sampled data may need to be transmitted fully from the gateway to the server, this prevents a transmission of the data when no significant actualization in the subsampling parameter may be required.

In step 450, a new compressive sampling scheme may be determined for a subsequent sampling time window. The new compressive sampling scheme may be based on the predicted (normalized) sparsity. The new compressive sampling scheme may be further based on a noise level of the sensor. A new subsampling parameter may be determined based on a correlation between the sparsity and subsampling parameter M. The correlation M(S) may be further trained or enhanced with machine learning method. For example, the correlation M(S) may be trained in the cloud environment 140. Optionally, the correlation M(S) may be enhanced based on the noise level expressed by the Signal to noise ratio SNR as an additional parameter (modeling the subsampling rate additionally as a function of the SNR: M(S, SNR)). For example, average normalized noise components of the sampling time window p may be determined. Alternatively, a range of suitable new subsampling parameters M may be determined. Or a lower bound of a suitable new subsampling parameter M may be determined. The new subsampling parameter M may be further used for regrouping the sensor to another multiplexing transmission scheme. Based on the new subsampling parameter M the new compressive sampling scheme may be selected from a pre-generated set of compressive sampling schemes. Likewise, the new compressive sampling scheme may be (dynamically) generated for the new subsampling parameter M.

In step 460, the new compressive sampling scheme may be provided to the respective sensor or gateway 110 or server 130. The new compressive sampling scheme may also be stored in a sampling database.

In general, a sparsity of a signal may remain the same for a certain amount of time. Likewise, the sparsifying transform associated with the signal may remain the same as well. In such cases, one may combine a compressive sampling scheme and a Nyquist sampling scheme, just as in an alternating sensing scheme, so as to determine the sparsity and may be used also to find an optimized sparsifying transform for the signal following the adaptive sparsification scheme.

Figure 5:
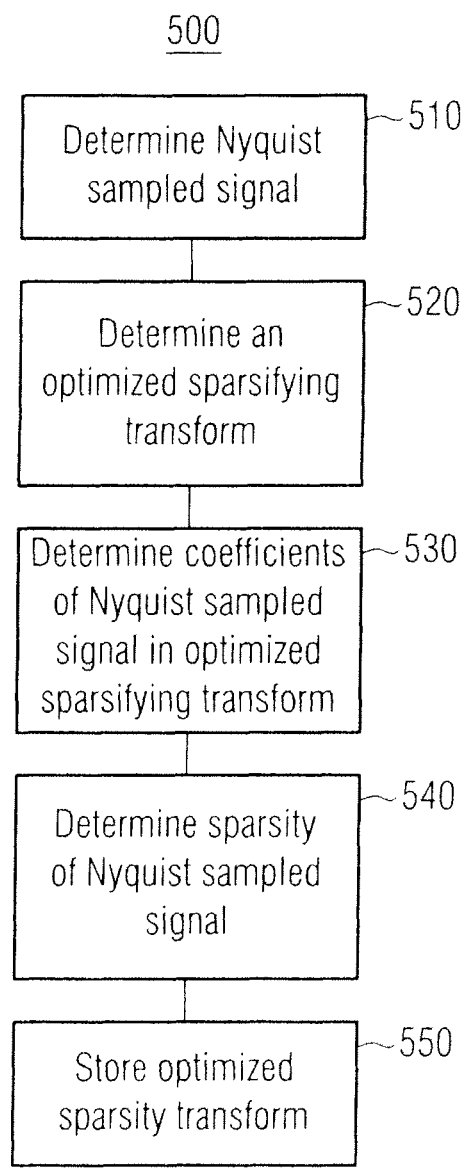
FIG. 5 illustrates an adaptive learning routine.

FIG. 5 illustrates an adaptive learning routine 500 for determining an optimized sparsifying transform and/or coefficients for expressing a signal in the optimized sparsifying transform.

In step 510, a Nyquist sampled signal may be determined. For example, the Nyquist sampled signal with N sensor values may be received from an alternating sensing scheme which may include a Nyquist sampling time window. At this point the predicted sparsity S(p+1) as derived from the adaptive filtering schemes at a previous step may be used.

In step 520, an optimized sparsifying transform may be determined for representing the Nyquist sampled signal in the optimized sparsifying transform. The optimized sparsifying transform may be optimized so as to represent the Nyquist sampled signal with a minimum number of coefficients from the optimized sparsifying transform.

The optimization scheme may be based on the CPPCA scheme, using the sparsity S(p+1) as the input parameter for the determination of the projections coefficients. This step may be particularly suited for its implementation in the gateway 110 due to its lightweight implementation. The full set of PCs may be approximated in the server 130, allowing to update the sparsifying transform applied in the same server to reconstruct the underlying signal. The same sparsifying transform may be set constant over a specific number of Nyquist sampling windows, until it may be actualized again. The actualization may be set periodically or it might be triggered when the distribution of the decomposition components might change above a determined threshold from the previous step.

A routine using the CPPCA scheme may run continuously during all Nyquist sampling windows and may be used to retrieve critical frequency information and predict subsequent sparsities.

A further optimization scheme for determining the sparsifying transform may be based on the Lasso optimization method:

$$\min_{A,D} \lambda \|A\|_1 + \frac{1}{2}\|x - DA\|_2^2$$

In the mathematical equation above, D denotes a dictionary, A denotes a set of sparse coefficients associated with the dictionary, x denotes the Nyquist sampled signal, and $\lambda$ a regularization parameter of the Lasso optimization method. In the Lasso optimization method, either A or D may be iteratively optimized. The dictionary $D=\psi\phi$ may be decomposed into a sparse dictionary $\phi$ and a basis dictionary P (e.g., DFT, DCT, etc.). As an alternative an optimized sparsifying transform may be determined by using the Coefficient Reuse OMP (CoefROMP) algorithm.

In step 530, coefficients for representing the sparse signal in the optimized sparsifying transform may be determined. These coefficients may correspond to the set of coefficients A determined from the Lasso optimization method.

In step 540, a sparsity of the Nyquist sampled signal may be determined as the number of nonzero coefficients from among the coefficients determined in step 530. Said determined sparsity may also be used in the sensing adaption routine 400, for example, in step 410. In step 550, the optimized sparsifying transform determined either by CPPCA or the Lasso optimization scheme may be stored in a sparsifying transform database. Likewise, the coefficients may be stored in a decomposition database and may be further associated with the optimized sparsifying transform stored in the sparsifying transform database. For example, in an application, these coefficients may be queried in order to retrieve critical frequency components which an user might be alarmed of.

According to an embodiment, during an adaptive sparsification phase, an actualized sparsifying transform may be determined, so as to adapt to the sparsity of a signal. The new sparsifying transform may be used to evaluate the new sparsity of the signal at the sensor 121. During the adaptive sparsification phase, decomposition parameters of the signal may be detected. For example, the gateway 110 or server 130 may use a CPPCA (Compressive-Projection Principal Component Analysis) method for extracting the k projection coefficients. According to an embodiment, a new sparsifying transform may be approximated in the server 130 by using the same CPPCA method. During an adaptive sparsity detection phase, a subsequent sparsity parameter may be identified. For example, an adaptive filtering scheme may be used for predicting a sparsity of a subsequent sampling period. In an adaptive subsampling phase, the subsampling parameter may be determined, adapted and/or actualized.

The subsampling actualization scheme of M may be interleaved with an approximation scheme determining the underlying optimal PCA projection coefficients of the underlying data sets. This scheme may be interleaved again with the adaptive filtering scheme or methodology determining the (normalized) sparsity at subsequent Nyquist sampling periods. According to an exemplary embodiment of the invention, such a method is described by the following steps, which can be performed in the following order:

1. Initialization: Set sparsity parameter k to the size of the data window to analyze. As an example, the CPPCA (Compressive-Projection Principal Component Analysis) method can be used during the Nyquist phase at window p as the approximation method for the projection coefficients. This is described in more details in "Compressive-Projection Principal Component Analysis" by James Fowler, retrievable from http://my.ece.msstate.edu/faculty/fowler/Publications/Papers/Fow2009.pdf, which is incorporated herewith by reference. All N coefficients that may be required for the whole characterization may be computed and transferred to the server 130. Alternatively, the PCA procedure may be directly performed in the server 130, upon transmission of the original Nyquist sampled data. For all k=N steps, the CPPCA approximation method may be applied using random projections. A sparsifying transform may be recomposed with the recovered projection coefficients in the server 130. The single projection coefficients may be further filtered by a low pass filters to avoid unnecessary noise components in the final reconstructed signal.

2. Sub-Nyquist sampling period: The N×N sparsifying transform approximated in the server 130 may be applied to the incoming reduced vector to reconstruct the original data vectors during 90% of the time. The remaining 10% of the time, a Nyquist scheme is applied.

3. Adaptive filtering learning process: The steps 1 and 2 may be repeated until the deviation of the predicted and the real sparsity values registered during subsequent Nyquist sampling windows is minimal. The resulting sparsifying transform at the end of this process may be fixed for subsequent Nyquist and sub-Nyquist sampling periods until an update may be required. For example, an update may be required when dynamics of an underlying signal change (as determined by a change in the projection coefficients above a determined treshhold. This may be detected at the gateway and further notified to the server).

4. Subsampling adaptation process: During a subsampling adaption window 331 the subsampling parameter M may be updated while keeping the sparsifying transform fixed, based on the predicted sparsity S(p+1). That is, during the subsequent Nyquist sampling periods only the subsampling parameter M is updated while at the same time the sparsifying transform is kept fixed. During all Nyquist phases, the predicted sparsity value S(p+1) from the previous values S(1) to S(p) may be determined both in the gateway 110 and the server 130. The subsampling parameter value may be determined beforehand by an exact prediction model M(k,N), with M the subsampling parameter, k the sparsity and N the size of the studied sampling window.

5. Sparsifying transform adaptation process: With a well defined periodicity of the Nyquist sampling period (i.e. after the predetermined time at which the dynamics of the data change notoriously) the updated sparsity S(p+1)=k may be defined as the input parameter for the CPPCA method which the gateway 110 may use to extract the projection coefficients. Only the k most important steps may be computed and the coefficients may be transmitted to the server 130. At the server 130 the k projection coefficients may be computed. The rest of the N-k coefficients may be copied from the previous PCA decomposition (they describe frequency components with the least variance in the data). Alternatively, if there are no bandwidth limitations between the server 130 and the gateway 110, a dictionary learning method may be used, which may require the transmission of the complete Nyquist sampled dataset from the server 130 to the gateway 110.

6. The gateway may use the k projection coefficients determined during the CPPCA encoding process and compare them with the k projection coefficients determined at the previous steps. An alarm may be triggered, if a significant difference between some of the entry values of the k, projection coefficients is determined. As the same coefficients and corresponding PCA transformation are synchronized in the server 130, the same information about the alarms can be shared with the server. According to an exemplary embodiment, the CPPCA method may be performed continuously over all Nyquist sampling periods in order to continuously determine changes in specific frequency ranges and, if desired by a user, to inform him about the changes.

7. The sparsifying transform is updated and the steps 3. and 4. running during the subsampling adaptation process may be repeated until the next required update in the sparsifying transform is required in order to adapt to the new data dynamics.

This concept has the advantages that the data reduction is adapted both to the data ingestion volume and the dynamical variety of data. For example, variations during high/medium/low use of machine (such as a car) may lead to changes in the dynamics of the data. Nevertheless, an optimal reconstruction quality set by the user may be maintained by the adaption process.

Another advantage is that the computational resources and the memory footprint for storing a full set of PCA components in the gateway 110 are reduced.

Another advantage is a reduction of the overall transmission bandwidth: A reduced set of projection coefficients may be transmitted from the gateway 110 to the server 130 instead of the whole Nyquist sampled data.

Another advantage is that the adaptive filtering scheme allows combining mutually exclusive schemes: Compressive sensing (CS) and CPPCA sparsifying transform estimation. The first (CS) may function under the conditions of a known sparsifying transform and unknown sparsity, whereas the second (CPPCA) may deliver a sparsifying transform from a known (such as predicted) sparsity parameter. According to an exemplary embodiment of the invention, only the server 130 may need to store a sparsifying transform.

According to an embodiment, the same adaptive filtering technique may be applied when using online streaming solutions, such as Streaming Greedy Pursuit (SGP) or Recursive Compressed Sensing (RCS) schemes. Then, instead of a reconstruction of finite length sized blocks used in the compressed sensing scheme, a reconstruction of the data points with an actualization rate given by each new sampling time may be performed and/or required. In this embodiment, the sparsity of the underlying signal may be acquired periodically at specific snapshots of the underlying finite length signal of the SGP or RCS scheme and may be used for predicting sparsities of subsequent sampling periods.

According to an embodiment of the invention, a routine for reconstructing a compressively sampled signal on a reconstruction time window with reduced length may be implemented. For some applications it may be useful to recover a sparse signal in a reduced reconstruction time window. For example, when a sampling time window of a compressive sampling scheme corresponds to an hour, but only the $1^{st}$ 30 minutes of said hour may be desired for data analysis. Then, the reconstruction of the remaining 30 minutes of reconstructed signal would be expendable. According to another example, the reconstructed signal from minutes 15 to 30 of the sampling time window may be desired. In either case, a decoding time may be reduced such that the reconstruction of a signal is performed for a reduced length of time interval/window within the sampling time window. According to an embodiment, a time interval or window over which the reconstruction from the compressively sampled signal is to be performed may be reduced.

When a compressively sampled signal may be subsampled with a block structured subsampling with block length B, then the length of the reconstruction time window may be reduced based on the block length B. Such block structured subsampling may be defined by a Hadamard transform with block length B. To follow the first example above, where the first 30 minutes of the one hour long sampling time window is of interest, the block length may be selected as B=2 and the reconstruction may be performed for the first block (out of the 2 blocks defined by B=2). In the other example, where the one hour long sampling time window may be divided into 4 equally long parts (i.e., each part corresponds to 15 minutes). Then the block length may be selected as B=4. If a desired subwindow of the sampling time window falls within the second part of the sampling time window, the reconstruction may be performed for the second block (out of the 4 blocks defined by B=4

In the following, the routine for reconstruction of a compressively sampled signal y on a reduced reconstruction time window (also referred to as subwindow) are elucidated. For that, it is assumed that the compressively sampled signal y may be associated with a subsampling parameter M (which may correspond to the number of sensor values the signal comprises).

In a first step, a block length (or size) B may be determined. The determined block length B may be used to define a corresponding reduced reconstruction time window for the compressively sampled signal. The block length B may be a positive integer number which may be larger than a lower bound LB (corresponding to a required minimum number of signal length required for performing a reconstruction).

In a second step, a block index b corresponding to a desired reduced reconstruction time window may be selected. For example, if the block length is determined as B=2, the block index may be 1 or 2, depending on which reduced reconstruction time window, the first or the second, may be desired for reconstruction.

In a third step, a measurement matrix associated with a block structured subsampling with block length may be constructed. According to an embodiment, the measurement matrix may be constructed by multiplying a Hadamard transform H (M, B), wherein M may be identical to a subsampling parameter associated with the compressively sampled signal, and B may be a block length of the Hadamard transform, with a random permutation matrix I(P). Alternatively, the columns of the Hadamard transform H (M, B) may be permuted randomly.

In a fourth step, the compressively sampled signal may be subsampled with the block structured subsampling. For example, the compressively sampled signal may be multiplied with the Hadamard transform H (M, B). The block structured subsampling may result in a block subsampled vector associated with the compressively sampled signal.

In a fifth step, an offset vector for initializing the reconstruction may be determined. For example, the offset vector may be determined from a Nyquist sampled signal associated with the compressively sampled signal. As such, the offset vector may be identical to a vector defined by the N sensor values of the Nyquist sampled signal, i.e., the vector may be constituted by each of the sensor values ordered according to their corresponding sampling time instants.

In a sixth step, a reconstruction of the compressively sampled signal in a reduced reconstruction time window may be performed and a reduced reconstructed signal may be obtained. The reconstruction may be performed based on a previously determined block index b which may indicate for which reduced reconstruction time window the reconstruction may be performed. After performing the reconstruction a reduced reconstructed signal may be determined.

In a seventh step, the reduced reconstructed signal may be displayed. Alternatively or additionally, the reduced reconstructed signal may be decomposed into its frequency components, and a critical signal condition may be determined by analyzing its frequency components.

FIG. 6 illustrates a database system 600 for managing sensor data or sensor values, which may be received from one or more sensors 120. Database 150 of FIG. 1 may be implemented as the database system 600 or by any of the components 610 to 640 of the database system 600. The database system 600 may be a distributed database system or database cluster with a plurality of database nodes. The database system 600 may be a compressive sensing based database architecture, which may allow retrieving data without fully reconstructing compressively sampled signals. The database system 600 may comprise one or more databases 610 to 640. Data on the database system 600 may be distributed across all databases and/or database nodes so as to distribute an access load of the database system 600. The data may be distributed randomly over different database nodes. The database system 600 may comprise relational databases, post-relational databases, document-oriented databases, or column-oriented databases.

A first database 610 (herein also referred to as "message database") included in the database system 600 may store sensor values. Each database may be a column or row indexed database. At each database, each sensor value may be received with additional metadata. Metadata may comprise headers or message headers describing a sensor 121 associated with the received sensor value, e.g., the metadata may comprise geo-location tags describing the location of the sensor 121. This may be useful for mobile sensors, such as sensors in a smart phone or a vehicle. The metadata may also comprise an indication of a compressive sampling scheme or Nyquist sampling scheme used to acquire the sensor value. The metadata may also include tags describing the sensor value. The metadata may be stored as a set of tags (key-value pairs) that may describe each single sensor value. For example, a tag may indicate the physical unit in which the sensor value may be retrieved, e.g., a temperature value, frequency value, position, vibration, acceleration, etc. The metadata may also include a timestamp associated with the received sensor value, wherein the timestamp corresponds to a sampling time instant when the sensor value was acquired. The timestamp may also correspond to a time instant defined in a compressive sampling scheme or Nyquist sampling scheme.

Compound Data Compression and Delta-Type Reduction Scheme

Received sensor values from the plurality of sensors may be prepared for a further data reduction using data compression. Text data, which may be part of headers received along a sensor value, may be further reduced and thus the total data to be stored in the database system 600 may be further reduced. Additional header information (or metadata) may be generated in the gateway 110 or a sensor 121. The header information (or metadata) may be received together with a sensor value in a message. In order to reduce the transmission bandwidth required for their transmission with each sensor value, the header information may be transmitted using a delta-type technique transmission: According to an embodiment, only upon a change of the corresponding header information in the gateway 110 (for example a status change of a sensor), the header information entry may be transmitted together with the sensor value.

Once a whole set of sensor values (that is to say a compressively sampled signal) is received at the gateway 110 or server 130, it may be further stored in a data batch, wherein the data batch may be constrained to the size of the sampling time window. Furthermore, compressively sampled signals from other sensors sharing a common sampling time window according to a multiplexing transmission scheme may be stored in the same data batch. The data batch may be stored in a compressed way, either in a compressed file (A) or in the form of a reduced number of entries in a database (B). The compression scheme (A) may be based on a traditional LZ or Huffman coding scheme being applied to the entire data batch.

The compression scheme (B) may be based on a redundancy reduction scheme. For a header information entry which may be repeated for subsequent sensor values, only a pointer to that header information entry and a corresponding index may be stored in a database 610, e.g., in a column. The entries within that column may correspond to the indices of that sensor value or sampling scheme. The compression scheme (B) may be combined with the storage of compressive sampling schemes and compressively sampled signals. Corresponding timestamp information may be already included in compressive sampling schemes used for generating time-multiplexed compressively sampled signals. These timestamps may be used as pointers to the corresponding sensor values stored in the data batch or the message database 610. Using these reconstructed timestamps as pointers allows to significantly reduce the storage size, as they may be highly redundant among the different columns storing data generated during subsequent time windows. The same procedure may be applied on data acquired over subsequent time windows: Only the offset timestamp is stored for each time window, while only the relative timestamps may be stored and used as pointers for a further data reduction. A sampled signal (either compressively sampled or Nyquist sampled) may be received in one or more messages. For example, the sampled signal may be received in a batch message including all M (in case of a compressively sampled signal), respectively N (in case of a Nyquist sampled signal) sensor values of the sampled signal. Likewise, each sensor value of the sampled signal may be received in a plurality of messages wherein each message may include one or more sensor values and optionally metadata associated with each one sensor value.

As a compressively sampled signal may be received, the M sensor values of the compressively sampled signal may be stored in the same order, which may correspond to the order of sampling and/or transmission of each of the sensor values. The same may hold true for a Nyquist sampled signal, that is, the Nyquist sampled signal may also be stored in a time-order preserving manner.

As a compressively sampled signal may be received, the M sensor values of the compressively sampled signal may be stored in the same order, which may correspond to the order of sampling and/or transmission of each of the sensor values. The message database 610 may be a column indexed database. For storing a Nyquist sampled signal (comprising N sensor values) N entries in a column of the message database 610 may be reserved for storing the N sensor values. Likewise, additional entries may be reserved for storing metadata received along with sampled signal.

According to an embodiment, the sensor values of a specific sensor may be stored in a specific column of the message database 610. As such each sensor may be associated with a specific column which exclusively may store sensor values of said each sensor.

Nyquist sampled signals and compressively sampled signals of a specific sensor may be stored together in the same column of the message database 610. In addition, an indication entry may be placed between the sensor values of a Nyquist sampled signal and a compressively sampled signal, so as to indicate that subsequent sensor values are associated with another sampling scheme. The indication entry may indicate a change from Nyquist to compressive sampling scheme or the other way around. There may also be two distinct indication entries, one indicating a change of the sampling scheme from Nyquist sampling to compressively sampling and the other indication entry may indicate the other opposite direction.

Likewise, Nyquist sampled signals and compressively sampled signals of a specific sensor may be stored separately in the message database 610, for example in separate columns.

According to an embodiment, the message database 610 may jointly store compressively sampled signals associated with different sensors. For example, it may store compressively sampled signals of different sensors in the same column. Multiple sensors 120 using a time multiplexing transmission scheme may share a common sampling time window. The common sampling time window may have a number N of sensor values associated with it. Said number N may correspond to a number of sensor values when the sampling time window is used for a corresponding Nyquist sampling scheme. The message database may reserve N entries for storing the received sensor values from sensors using a time multiplexing transmission scheme. For example, two sensors 121 and 122 may both share a common sampling time window of length N and each compressive sampling scheme for each respective sensor may comprise M N/2 time instants. Using a sampling and direct transmission approach, each sensor may transmit their compressively sampled signals (each comprising at most N/2 sensor values) as each single sensor value may be acquired. Each sensor value may be received within a message. The database system 600 may receive each sensor value of each respective sensor and may subsequently store each sensor value in a common column or row of the message database 610 with or without distinguishing to which specific sensor a received sensor value belongs. In other words, the received multiplexed sensor values may be stored in a multiplexed manner on the message database 610. Each stored sensor value may be stored along with a timestamp or an indication to which sensor the respective sensor value may be associated. Likewise, an indication of a compressive sampling scheme which was used to acquire the compressively sampled signal comprising the M sensor values may be stored along with the sensor values. This procedure may better leverage the existing database architecture as the number of rows to be reserved for a write query are determined by the number of Nyquist sampling points N and not by the varying subsampling parameter M. Therefore, the resource allocation of the database is adapted better to the ingestion speed of data, while increasing the effective ingestion speed.

Alternatively, the received multiplexed sensor values may be demultiplexed before storing them in the message database 610. That is, each received sensor value is assigned or associated to a sensor which acquired the sensor value. The demultiplexing may be based on a compressive sampling scheme associated with a sensor, by relating a sampling time instant of the compressive sampling scheme with the time when the sensor value is received. Or with a timestamp that may be included in a message comprising the received sensor value, wherein the timestamp corresponds to the time instant when the sensor value was acquired.

Each sensor value of a compressively sampled signal (comprising M sensor values) may be stored in the same order as each sensor value was acquired according to the compressive sampling scheme. In addition, an In-Memory database may be prepared for storing a number of N sensor values, wherein N corresponds to the number of sensor values when the compressively sampled signal may be reconstructed (or in other words, N corresponds to the length of the corresponding Nyquist sampled signal). For example a list, array, vector or the like with N entries may be prepared for storing N sensor values. Each of the M sensor values of the compressively sampled signal may be placed in an entry in the In-Memory database corresponding to a time instant when the sensor values were sampled according to a Nyquist sampling scheme. As such, the In-Memory database may store a prepared subsampled signal of the compressively sampled signal with gaps/voids at the time instants where no sensor value was acquired during a sampling time window (associated with the compressive sampling scheme). The prepared subsampled signal may be used to make the compressively sampled signal suitable for real-time processing applications or for visualization applications. For example, the prepared reconstructed signal may be displayed in a user interface, such as a plot, graph, or chart.

A second database (herein also referred to as "subsampling database") 620 may store compressive sampling schemes. A compressive sampling scheme may comprise indices corresponding to time instants of a sampling time window. As such, each index may define a time instant at which a sensor value shall be acquired and optionally transmitted. The purpose of a compressive sampling scheme may also be represented by a subsampling matrix. Such subsampling matrix may be constructed from a compressive sampling scheme and an identity matrix with size N×N, wherein N corresponds to a length of a reconstructed, respectively Nyquist sampled signal. In an embodiment, each index of the compressive sampling scheme may correspond to a row of the identity matrix. For example, if the compressive sampling scheme includes the indices 3 and 5, these indices correspond to the $3^{rd}$ and $5^{th}$ row of the identity matrix. One may then go through each index in the compressive sampling scheme and keep only those rows of the identity matrix having a corresponding index in the compressive sampling scheme. These indices need to correspond exactly to the indices used to determine the compressive sampling times at which the sensor data is acquired at the sensor/gateway hardware. In the end, the subsampling matrix may emerge as an M×N matrix with only those rows of the identity matrix which were defined by the indices of the compressive sampling scheme. A compressive sampling scheme may be associated with a specific compressive sampling time window and/or a sensor, as is required for reconstructing the data and which may be stored in a separate database. This database may denote the key storage database in an encryption method, as the stored schemes are required both in the gateway and the server to reconstruct the underlying signals (uniquely).

A third database (herein also referred to as "sparsifying transform database") 630 may store sparsifying transforms. A sparsifying transform may be represented as a matrix. Each stored sparsifying transform may be associated with a particular compressive sampling scheme and a sampling time window. The size of a sparsifying transform may correspond to a N×N matrix, wherein N corresponds to a length of a reconstructed, respectively Nyquist sampled signal. When using the adaptive sparsifying transform scheme the storage space required for storing the matrices and overall data transfer rates may be considerably reduced. Only at the initialization of the routine a N×N matrix corresponding to the initial sparsifying transform may be stored. This may be set as the standard DCT or Fourier transform. Subsequently, only k vectors, with k corresponding to the sparsity may need to be stored at each subsequent actualization step.

A compressively sampled signal (comprising M sensor values) may be reconstructed, so as to correspond to a Nyquist sampled signal with length N. The reconstruction may be performed by using a Lasso reconstruction or Greedy reconstruction methods.

A fourth database (herein also referred to as "decomposition database") 640 may store decomposition components (also denoted as "frequency coefficients" or "coefficients") of a Nyquist sampled signal or those to be determined from a compressively sampled signal. The frequency components of the Nyquist sampled signal may be determined by decomposing the Nyquist sampled signal into its frequency coefficients in a given sparsifying transform. For example, when the Nyquist sampled signal may be regarded as a vector of length N, wherein each component of the vector corresponds to a sensor value of the signal, then the frequency coefficients may be determined by multiplying the vector with a matrix corresponding to the given sparsifying transform. The sparsity matrix may be obtained from the sparsifying transform database which may be updated during the sparsifying adaptation step. The decomposition coefficients may correspond to the frequency components using the actual sparsifying transform. Likewise, the frequency components may be determined from step 320 of the sparsity determination routine. For storing the k frequency components of a Nyquist sampled signal k row entries in the database 640 may be reserved followed by an additional index entry identifying the associated sparsifying transform in database 630. These coefficients may have been determined using the CPPCA scheme applied in the gateway and further sent to the database, but may be generated as well directly in the server.

The frequency components determined from a compressively sampled signal may be obtained from a previous reconstruction of the compressively sampled signal. The reconstruction may be initiated once a query requesting the frequency components may be received or performed. The reconstructed signal may be stored in the in-memory database only and further on deleted with each actualized sampling window. As a general rule in the compressive sampling framework, sampling a signal with 4 times the amount of the sparsity k may suffice to obtain enough information in order to reconstruct the compressively sampled signal. For storing the frequency components of a compressively sampled signal M/4 rows or columns in the decomposition database may be reserved, wherein M denotes the subsampling parameter used in the associated compressive sampling scheme.

The stored frequency components in the decomposition database may be associated with a sampling time window and/or a sensor. They may be further associated with a corresponding sparsifying transform, which may be stored in the sparsifying transform database 630. When querying for a signal in the original domain (that is the domain in which the signal was sampled, e.g. time domain), the signal may be obtained by multiplying the stored frequency components with the corresponding sparsifying transform. Such multiplication may be skipped, if the signal is queried in a domain corresponding to the sparsifying transform in which the frequency components may be already stored. Then, the frequency components themselves may be returned to the query. According to an embodiment, the compressively sampled signal corresponding to a set of stored frequency components may be deleted (from the message database 610). This may allow further saving of storage space in the database system 600.

The latency for a frequency analysis and further filtering of data (sensor values or frequency components) may be significantly reduced, as the data may be stored in the database system 600 already in a frequency analyzed and filtered format, without having to conventionally decompress and frequency analyze it. Further, when using an optimized sparsifying transform which may provide optimal data reduction during the sampling of the signal and which may be selected in the adaptive learning routine 500 or sensing adaption routine 400, the optimized sparsity transform may be used as a frequency decomposition basis, too. As such, reconstructed data may be directly provided in terms of frequency components in the corresponding frequency decomposition transform (e.g. the optimized sparsifying transform). Querying data in the original data domain may require a multiplication of the frequency components with the corresponding sparsifying transform, in which the frequency components are expressed. Such multiplication step may be skipped if an analysis or query in the frequency domain is used.

The embodiment may be particularly advantageous for the querying of historical data that has already been stored in the database 640 as the compressive sampling reconstruction process may be skipped. Instead, using the decomposition components and the corresponding sparsifying transform the original signal may be recomposed. The decoding complexity may be thus reduced to the complexity of the encoding step, therefore considerably reducing the decoding time.

More advanced analytics may be deployed which may be based on the sparsity determination routine 300 or the sensing adaption routine 400. Advanced analytics may allow distinguishing between events not accessible in the original domain of sensor values. For example, an alarm signal for a vibration sensor in a car may be triggered based on a sensor value of the vibration sensor exceeding a threshold value. The sensor value may have exceeded the threshold for various reasons, e.g., a broken suspension of the car or a damaged road. A driver may desire to detect if the alarm signal was triggered because of a damaged road or due to a defect in the suspension of the car. Trespassing a specific damaged road may lead to an acceleration sensor to generate data (sensor values) with a specific frequency decomposition that may be different from that of a broken car suspension. The sensing adaption routine may be used for retrieving the sparsity parameters $S(p)$ of each new sampling time window. The routine 400 may be used to distinguish specific events from each other, by using a frequency filtering method, based on retrieving the decomposition components in the chosen sparsifying basis. The sparsity, respectively, the collection of sparsity $S(p)$ may describe a change in the frequency decomposition of a signal, and together with the set of decomposition coefficients they may be further used to detect an event associated with the change of the frequency decomposition. According to an embodiment, only sparsity values and a corresponding frequency decomposition of the associated signal may be stored directly in the database system 600 instead of the compressively sampled and further reconstructed signal. A storing of sparsities associated with a sampling time window may permit to define queries based on the sparsity of the associated signal. Further, data analysis and filtering latencies may be significantly reduced with respect to a conventional data compression and a Nyquist sampling scheme, as it may be the optimal decomposition of the signal already for the original acquisition of the signal.

Classification (Adaptive Querying)

According to an embodiment, querying of similar datasets (compressively sampled signals, respectively, the corresponding frequency decomposition of the original signal stored in the decomposition database 640) having a common subsampling parameter M, sampling rate or sparsifying transforms may be implemented. A measure of the similarity of datasets with an underlying training data set may be based on similar subsampling or either sparsity values. Further, a sparsity transformation or dictionary learning scheme, such as the adaptive learning routine 500, may be used for identifying optimal data reduction schemes for varying types of data with varying signal to noise ratios and frequency patterns/decompositions. The dictionary learning scheme may generate sparsifying transforms (or matrices) which may offer an optimal reduction rate for the studied data. The dictionary learning scheme may enable to further optimize data query performance within the database system 600, as data may be associated with similar features of the sparsifying transforms. Further, data may be sorted by identifying similar features on the generated sparsifying transforms. For that a further step may be performed in the sparsity determination routine 300 or sensing adaption routine 400: A multiplication of the Nyquist sampled signal or a reconstructed signal (from a compressively sampled signal) with a generated sparsifying transform and a setting of a threshold on the resulting frequency components of the obtained frequency decomposition may suffice to perform a classification of the incoming data. The incoming data may be classified by a determined sparsity or even more sophisticated classification patterns, e.g., those based on specific frequency patterns. The result of the frequency decomposition may allow classifying the incoming data into different databases, or database columns with a common sparsity structure of the incoming data. Storing the incoming data (sensor values) together with a determined similar sparsity structure may allow further optimizing of the querying of the data, since queries may be performed on data with similar decomposition structure. This may further improve data communication overhead specially for distributed database systems as these may require similar sparsifying transform for their reconstruction and classification.

Querying of Reduced Data

During a compressive sampling time window, a data writing query scheme may be more explicit for the database system 600. An exact time ordering of each sensor value of a compressively sampled signal stored into the database system 600 may be retrieved from a separate database, e.g., subsampling database 620, storing different subsampling parameters M together with corresponding compressive sampling schemes for different time multiplexed sensors 120. The total size of compressive sampling schemes may be limited by the total size of the corresponding Nyquist sampling time window of size N. Sensor values of each sensor may then be stored into a reserved entry in a database, e.g., messaging database 610, corresponding to a specific timestamp inside one column, while subsequent rows may be used to store the metadata (such as header information) allowing to identify different sensors 120.

Querying of Sensor Values

Sensor values stored in the database system 600 during a compressive sampling time window may be directly queried and visualized before a reconstruction of a signal to its full length (size N). This early querying may allow the identification of critical events (or critical signal conditions) without performing a reconstruction. An event may be associated with or indicate a critical signal condition. For example, a threshold value for the sensor values may be defined over which an alarm signal is sent out. This alarm signal may be used to inform a user of a car of an anomaly in the operation of the car (for example that the user is driving in difficult road conditions or alternatively that the car suspension might not be working). This scheme is intrinsic to placing the sparsifying transform into the server.

Reconstruction Scheme

Data query latency may be further reduced in the database system 600. The database querying may be further adapted to the structure of compressively sampled signals associated with a specific sparsifying (decomposition) transform (domain). A k step reconstruction method may applied directly on the compressively sampled signal of M sensor values and a number of k frequency components may be stored as separate entries in the decomposition database 640, while the sparsifying transform (or randomization matrix elements) may be stored separately, (e.g., in sparsifying transform database 630). An approximation using k steps may suffice to approximate sufficiently the underlying fully reconstructed signal corresponding to a Nyquist sampled signal and may further give direct access to the underlying frequency components. As such, the overall data querying and processing process may be speeded up.

The k step reconstruction method may be implemented by using the original dictionary (corresponding to the sparsifying transform) of the signal to be reconstructed and the predicted sparsity k as determined from previous Nyquist sampling schemes. Then the frequency components of the signal to be reconstructed may be retrieved by performing Lasso or other related greedy approximation methods (OMP, CoSaMP, BP) of the first k elements, wherein k corresponds to the sparsity determined for corresponding sampling time window. As at most k vectors may be required, the signal reconstruction is speeded up.

According to an embodiment, subsampling and sparsifying matrices may be stored in memory. A subsampling matrix may be derived from a compressive sampling scheme. Further on, in order to reconstruct the different time multiplexed signals the same decoding procedure may be implemented by sub-selecting specific submatrices out of measurement matrices such as to define the different time-multiplexed submatrices $D_i$. These submatrices $D_i$ may be associated to non-overlapping sampling time instants, which may be defined in compressive sampling schemes used for generating time multiplexed transmission schemes.

The compressively sampled signals of each sensor may be used to reconstruct an original signal of that specific compressive sampling time window. Likewise, the compressively sampled signals from a common sampling time window, in which multiple sensors may apply the multiplexing transmission scheme, may be reconstructed. The reconstruction may be performed by making use of greedy reconstruction methods, such as Lasso. The number of steps for determining an accuracy of the reconstruction may be controlled by setting a parameter, e.g. a parameter corresponding to a predetermined sparsity associated with the compressively sampled signal. Upon reconstruction of an original signal and the respective sensor values, the resulting original signal may be visualized in a common visualization routine as used for displaying the compressively sampled signal before performing a reconstruction. An actualization rate of the visualization of the compressively sampled signal may be given by the update rate of the sampling time window. A user may visualize the sensor values of the compressively sampled signal before the reconstruction and with an actualization rate defined by the arrival of the respective sensor values. The visualization of the compressively sampled signal may be updated once the overall sampling time window is completed. Then, frequency components associated to the compressively sampled signal may be stored in an In-Memory database that may allow performing analytics queries (queries on frequency components) on a small selection of a time window. Thus, in this example the analytics query may be constrained to the specific sampling time window which may be displayed before.

In addition, the frequency components of the resulting reconstructed signal may be stored in a separate database, such as a decomposition database 640.

Combined Queries

The database system 600 may enable combined queries of data. A signal may be stored in different domains, for example in the time domain in the message database 610 and in an arbitrary frequency domain in the decomposition database 640. Likewise, an associated sparsifying transform of the signal may be stored in the sparsifying transform database 630. New kinds of queries in the database system 600 may be formed which combine all three of the aforementioned databases. For example, one may construct a query for signals sharing a common or similar sparsifying transform. This condition may then be further combined with a condition in the time and/or frequency domain. Most importantly this querying may be performed in real-time and is restricted only to the server database architecture without needing to synchronize the storage of the sparsifying transform in the gateway at each new update, as may be required in conventional compressive sensing methods. As such, the associated network latency for a transmission of the sparsifying transform from the gateway to the server may be avoided, enabling to reduce the overall latency for frequency querying.

Compressively Sampled Signals and Frequency Components Querying

A distribution and synchronization of measurement matrices and sparsifying transforms (e.g., as sparsifying matrices) on all nodes of the database system 600 may provide each single database means to independently perform a reconstruction of data within any sampling time window. Compressively sampled signals (including sensor values) may be distributed within data packets of the size of the compressive sampling time window chosen for the acquisition of the sensor values. The size may define a data storage structure in form of M (compressively sampled) or respectively N (Nyquist sampled) entries of a storing column in a database, e.g., message database 610. A measurement matrix D may be constructed by a multiplication of a block based Hadamard H(M,B) matrix, wherein M may denote a dimension and B a block length of a Block based Hadamard matrix, and a subsampling matrix I(P) comprising a sub-sampling information of each compressively sampled signal, respectively. The subsampling matrix I(P) may be generated from a compressive sampling scheme associated with a corresponding compressively sampled signal. The components of the subsampling matrix I(P) may be directly retrieved from entries in the subsampling database 620, and may be recomposed to form a set of timestamps with a periodicity defined by the corresponding sampling time window and with a time resolution determined by the sampling resolution of a corresponding Nyquist sampled signal. For each compressively sampled signal a separate measurement matrix may be stored, as the sampling time instants for one compressively sampled signal differ from those of another compressively sampled signal with another compressive sampling scheme. For an appropriate amount of sampling time windows and a number of sensors, these measurement matrices may be stored in-memory or loaded into fast memory.

Using a dimensionally reduced Hadamard matrix H(M) may allow reducing the computational complexity of a data query on database system 600, as the required size of data blocks to be decompressed over a series of time windows and sensors may be reduced in order to query a specific set of data. Therefore the computing resources and processing time required to reconstruct data over subsequent sets of time windows may be substantially reduced with respect to a non-Block structure and with respect to other compression solutions. In applications which may require most reduction in data access latencies below a sampling time window and a reconstruction time, the sensor values of the compressively sampled signals may be directly queried together with a time stamp stored into the same database, such as message database 610. Similarly, the reconstructed signal within each block may be further decomposed into corresponding decomposition components, which may be further stored in database 640. A detection of a frequency component within the reconstructed frequency components, e.g., when a specific frequency component has a magnitude above a given threshold value, may be used to detect critical signal conditions or (critical) events associated. Each sensor value corresponding to a specific sampling time window and an associated sampling time instant may be reconstructed by applying a compressive block data read query over the database system 600.

Analytics Queries

In contrast to conventional compression methods, a direct querying of frequency decomposition components may be performed. Further join search queries among different sampling time windows of the sensor values, respectively frequency decompositions may be used for composing analytics queries, e.g., identification of critical frequency components or signal conditions within all sets of sampling time windows. As the sensor values of the compressively sampled signals may be stored in a time ordering preserving manner, the identification of sampling time windows may be further facilitated.

According to an embodiment, the scope of analytics queries may be further extended: As sensor values may be directly accessible on the gateway 110, the server 130, the database system 600, more specifically message database 610 one may set thresholds for the sensor values in order to identify critical signal conditions or events (in a signal or sampling time window of a sensor). Or alternatively one may acquire a fast approximation of the fully Nyquist sampled signal by including as an additional query parameter the number of steps set to reconstruct the signal, creating a k-vector approximation query of the signal (definition of query). Since a clear index relation between the two databases 610 and 640 may be established: For example, columns (query) of the decomposition database 640 may be associated to columns (queries) in the message database 610.

FIG. 7 illustrates a routine 700 for determining a critical signal condition associated with a sensor 121. The routine 700 may be performed by the gateway 110, a sensor 121, the server 130, the message broker 160, the cloud environment 140 or a database 150, such as the message database 610.

In step 710, a sensor value from a sensor may be received. For the routine it may be irrelevant whether the sensor value was acquired during a Nyquist or compressive sampling scheme.

As the sensor value is received, it may be compared with a given threshold A, in step 720. If the sensor value exceeds the given threshold A, then a critical signal condition may be determined. According to an embodiment, an average of the last m received sensor values may be determined, wherein m may be a user defined or fixed parameter. Then, a critical signal condition may be determined if the average exceeds a given threshold A. According to an embodiment, when the sampled signal may be received in a batch (instead of one sensor value, M sensor values may be received at once), each of the sensor values of the batch may be compared with a given threshold A and if at least one of the sensor values exceeds the given threshold A, then it may be determined that a critical signal condition is fulfilled.

In step 730, an alert may be indicated. Likewise, the sensor may be requested to change its sampling scheme. For example, it may be requested to perform Nyquist sampling for the next sampling time window. Or in another example, another compressive sampling scheme with a greater subsampling parameter M may be assigned to the sensor, so as to adapt its sampling scheme.

FIG. 8 illustrates a routine 800 for determining a critical signal condition associated with a sensor 121. The routine 800 may be performed by the gateway 110, a sensor 121, the server 130, the message broker 160, the cloud environment 140 or a database 150, such as the message database 610. The routine 800 may also be performed as part of a method for querying an event in a signal. The event may be associated with a portion of frequency decomposition. In general a frequency decomposition comprises one or more frequency components (also referred to as coefficients) and the frequency decomposition may be associated with a specific sparsifying transform.

In step 810, a Nyquist sampled signal (of N sensor values) may be received. In addition to the subsampling adaptation scheme, a sparsity adaptation scheme is deployed, both being interleaved with each other. For time critical applications sub-Nyquist sampled data may be used as well for deploying the subsampling adaptation scheme.

In step 820, the CPPCA scheme may be applied to the Nyquist sampled signal. The k projection coefficients retrieved after performing a CPPCA encoding of the underlying signal in the gateway may be received by the server. As an input parameter for the CPPCA scheme the predicted sparsity as determined by the adaptive filtering scheme may be used. This CPPCA scheme may be performed during all Nyquist sampling windows, or only when it is triggered by specific values which may be detected in the previous decomposition components of the previous sampling time window. For latency critical applications, the data retrieved during a sub-Nyquist sampling period may be used in order to retrieve the k most important decomposition components. Here, a LASSO reconstruction using the first k steps of the algorithm may be used in order to derive an approximation to the underlying frequency components. This implementation may be performed as well in the gateway, when time critical applications require a sub-network latency processing.

In 830, these components may be further compared with the set of projections coefficients determined at previous steps. If they match, then it may be determined that the critical signal condition is fulfilled.

In step 840, an alert may be indicated. Likewise, the sensor may be requested to change its sampling scheme. For example, it may be requested to perform Nyquist sampling for the next sampling time window and apply the subsampling and sparsifying adaptation scheme. In this sense in the next acquisition window a compressive sampling scheme with a greater subsampling parameter M may be assigned to the sensor, so as to adapt its sampling scheme. Finally, if a specific change in the distribution of the frequency components is detected with respect to the previous window, the sparsifying transform adaptation may be applied in order to adapt the acquisition to the new dynamics of the data. For example, this may be the case, when a machine generates a signal with different frequency characteristics and overall signal dynamics than in previous sampling time windows. Then, only after applying a sparsifying adaptation an optimal data reduction may be achieved again.

Reconstruction

According to an embodiment, a correlation of a plurality of compressively sampled signals may be exploited to increase the accuracies of the reconstructed signals. For example, sensors sensing the same kind of data (such as temperature) at a similar location may have strong correlations in their respective signals. In such cases, the Multiple Measurement Vector with Alternating Direction Multiplier (MMV-ADM) method may be used for reconstructing the signals for the plurality of sensors.

The architecture of the database system and the querying is optimized for managing streaming data and historical data. The streaming data may be managed by streaming the data in an in-memory database. The historical data may be managed by using long-term storage technology. A particular advantage for the historical data is that data querying can be significantly increased with respect to conventional compressive sensing methods: After performing a first reconstruction of the signal only the decomposition components may be stored in the database, such as decomposition database 640. Further, queries of the data may be performed within a timescale close to the encoding time, as this may require only a multiplication of the original decomposition components with the corresponding sparsifying transform. Therefore the whole encoding/decoding latency process of historical data may be considerably speeded up.

Messaging

According to an embodiment, a Nyquist or compressively sampled signal which may comprise one or more sensor values may be sent in a message.

The message may further include metadata or headers which may describe a sensor value among the one or more sensor values. Or they may describe the sensor. For example, the metadata may indicate the location of a sensor. Another example, the metadata may also indicate the type of sensor data (temperature values, position values, etc.).

The transfer of sampled signals may be performed using an application layer of a communication protocol. Likewise, the communication messages which may encapsulate sampled signals may be based on the application layer. Suitable existing communication protocols may be HTTP, HTTPS, CoAP or MQTT. MQTT is a publish-subscribe based messaging protocol for use on top of the TCP/IP protocol. It is designed for connections with remote locations. The publish-subscribe messaging pattern may require a message broker 160. The message broker 160 may be responsible for distributing messages to interested clients based on a topic of a message. The server 130 may subscribe to topics of the sensors 120 and may then receive sensor values or sampled signals.

Visualization

According to an embodiment, received sensor values of a compressively sampled signal may be displayed on a user interface within a plot, chart, graph, table, etc. before an associated compressive sampling time window of the compressively sampled signal is completed. That is to say, as each sensor value may be received, it may be displayed in a user interface (plot chart, graph, table, etc.). The user interface may be updated with every subsequently received sensor value. An alert for a determined critical signal condition may be visualized within the user interface. Missing sensor values from within the corresponding compressive sampling time window may be filled in after a reconstruction of the signal may be performed.

Technical Advantages for Database Querying

The compressive sampling technique may be deployed to adapt data write and read queries in the database system 600 and to improve query performance with respect to data querying schemes on compressed data. This is a technical benefit over standard compression/decompression schemes that allow reducing initial read-write queries at the cost of an increased query latency, processing complexity and overall energy consumption at a later point in time. Further on, in conventional compression methods the complexity of querying of compressed data upon the decompression process is greatly increased, since compression ratios of conventional compression solutions are unpredictable. In contrast, according to an embodiment, it may allow retrieving single sensor values and/or a portion of the reconstructed signal on demand by respective queries performed at the database system 600, e.g. at a processing unit of the database system 600. The advantages of these embodiments are the following:

1. The performance of the database system 600 may be improved in comparison to known systems using conventional compression methods, specially for floating point data which may be generated in streaming applications, such as sensor streaming/sending sensor values in a signal. Typically, compression ratios above 75% are difficult to achieve using conventional compression methods.

2. Data querying may be performed directly on a column that comprises the compressively sampled signals and time ordered data stored in the message database 610 and may further benefit from the increase in the information storage density due to compressive sampling and time-multiplexing of the compressively sampled signals. The sensor values which may be stored in message database 610 may be accessed before requiring a decompression of the full signal sampled over a corresponding sampling time window. Further on, a decompression latency may be reduced for accessing only a portion of a reconstructed signal of the compressively sampled signal. This latency is further decreased by making use of Block structured of compressive sampling schemes. Such direct access of a portion of the reconstructed signal would normally not be possible for conventional compression methods, without having to decompress the whole compressed file.
3. Conventional data compression methods apply queries for performing exact-match and natural join operations directly on compressed data. A major improvement with respect to Lempel-Ziv and Huffman compression methods is achieved, as these methods require the decompression of a large fraction of the data in order to apply the more complex queries on the stored data. Further complex queries (such as PCA, SVD, Fourier decomposition data) that may need to be applied on the decompressed data may profit from the same advantages. A frequency component query scheme as described under FIG. 6 and FIG. 8 may be used.
4. The overall data reduction rate in the database system 600 may be reduced especially for floating point data types and especially for a compression at an attributed level instead of a file level. A compression at this level may be particularly valuable in order to increase query performance without running into increased compression/decompression CPU and communication costs. A main limitation for current conventional databases is that specially for Huffmann coding and arithmetic based schemes a compression at the attribute level reduces the statistics of used tables and therefore an overall compression ratio that is achievable with such coding schemes. In contrast to these schemes, the database system 600 increases data reduction, specially for floating point data point stored at the attribute level. Here, Huffman and arithmetic based schemes may not achieve optimal data reduction rates, due to their dependence on a high statistical redundancy in the data to be compressed.
5. For compressively sampled signals and specially for compressive time-multiplexed signals the overall transmission from the database system 600 to the server 130 may be accelerated, thus increasing the overall read/write query speed specially for distributed data clusters, such as database system 600. Read/write queries and memory storage time may be reduced in the database system 600 and therefore the overall data processing latency with respect to data compression schemes. In order to use data analytics schemes, such as sort or search, it may suffice to apply the querying on the compressively sampled signals, which may be stored in the message database 610, and store a portion of of the compressively sampled signal in memory. Requested queries, such as sort, search, retrieve data decomposition, may be applied to only a portion of a compressively sampled signal and one may obtain a first preliminary insight into the compressively sampled signal. A reconstruction may be performed once a sensor value exceeds a critical threshold (i.e. at a minimal standard deviation). In this case, the reconstruction may be performed either in the original domain of the sampled signal or in a frequency domain and the reconstructed signal may be stored in a corresponding in-memory database, for example, for its visualization.
6. The sensing routine may be adapted to keep a data sampling reduction rate constant while maintaining an acceptable data reduction rate. For highly dynamic signals, the corresponding compressively sampled signals and their sensor values may be queried by storing the different sampling time windows according to their respective data reduction rates. Data with similar dynamic may therefore be queried within the same querying process, which may provide a significant increase in the analytics performance based on a frequency decomposition or sparsity of the signals: Data (sensor values, frequency components, compressively sampled signals, metadata or compressive sampling schemes) may be linked to a specific sparsifying transform, reducing the complexity of communication of the sparsifying transform and subsampling matrix during an entire query process.
7. A common problem for conventional compression methods based on LZ of Huffman coding scheme require large block and a corresponding number of disk accesses to decompress the data. Once a decompression is requested to access an entry within the block in a conventional compression method, all the data contained within the block needs to be decompressed. Here, the size of the block to be decompressed may correspond to the time window of sensor values acquired within a selected time window. According to an embodiment, a reduction rate may depend only on subsampling parameter M and not the input entropy of sampled data or signal itself (as used by conventional compression methods). Therefore, the size of a block to be reconstructed upon a request or query may be significantly reduced, allowing to significantly reduce CPU cost.
8. Data querying speed is considerably speeded up with respect to state of the art compressive sensing theory once a first reconstruction has been performed. This is so as only the most important frequency components of the reconstructed signal are stored in the database. Querying historically stored data may require only calculations involving the stored coefficients and the corresponding sparsifying transform (matrix), achieving reconstruction speeds at the same order of magnitude as the encoding speed.

The invention claimed is:

1. A computer-executable method for querying sensor data of a plurality of sensors, the method comprising:
   receiving sensor data, the sensor data comprising sensor data values sampled by a first sensor of said plurality of sensors according to a first compressive sampling scheme, the first compressive sampling scheme being applied by the first sensor within a sampling time window, the received sensor data corresponding to samples of a signal within the sampling time window;
   storing the sensor data in a first database;
   computing a frequency decomposition of the signal based on a sparsifying transform associated with the first compressive sampling scheme and the received sensor data, wherein the frequency decomposition comprises one or more frequency components;
   storing the one or more frequency components in a second database;
   receiving a query from a client, the query specifying an event that indicates a critical signal condition of a signal; and
   detecting whether the event exists using the one or more frequency components.

2. The computer-executable method of claim 1, wherein the event is associated with at least one given threshold value;

wherein the at least one given threshold value relates to at least one of the stored sensor data values in the first database;

wherein the event is detected,
if at least one of the stored sensor data values in the first database exceeds the at least one given threshold value.

3. The computer-executable method of claim 1, wherein the event is further associated with a portion of a given frequency decomposition, the given frequency decomposition further being associated with the sparsifying transform;
the portion of the given frequency decomposition defining a frequency pattern for identifying the event, wherein the portion of the given frequency decomposition includes one or more frequency components;
comparing the portion of the given frequency decomposition with the computed one or more frequency components of the frequency decomposition;
wherein the event is detected,
if the portion of the given frequency decomposition matches to a portion of the stored frequency components of the signal.

4. The computer-executable method of claim 1, wherein:
the query further comprises a request for a reconstruction of the signal within the entire sampling time window; and the method further comprises:
in response to the request, reconstructing the signal over the entire sampling time window, wherein said reconstructing comprises:
determining the sparsity transform associated with the first compressive sampling scheme applied by the first sensor within the sampling time window for the received sensor data, wherein the sparsity transform is stored in a third database;
determining the frequency decomposition of the signal, wherein said determining further comprises retrieving the one or more frequency components of the frequency decomposition in the second database; and
computing the reconstructed signal signal by a multiplication of the determined sparsifying transform with the frequency decomposition of the signal, wherein said multiplication is performed according to a matrix-vector-multiplication; and
returning the reconstructed signal to the client.

5. The computer-executable method of claim 1, the method further comprising:
receiving Nyquist sampled sensor data from the first sensor, wherein the Nyquist sampled sensor data comprises sensor data values sampled by the first sensor according to a Nyquist sampling scheme;
determining a classification of the Nyquist sampled sensor data, said determining the classification comprising:
decomposing the Nyquist sampled sensor data into a second frequency decomposition, said second frequency decomposition being associated with the sparsifying transform and comprising one or more frequency components;
determining a first given threshold value that is associated with a first classification from among a plurality of classifications;
comparing each frequency component from the second frequency decomposition with the first given threshold value; and
if at least one of the frequency components of the second frequency decomposition exceeds the first given threshold value, determining the Nyquist sampled sensor data correspond to the first classification;
associating the received sensor data of the first sensor with the determined classification of the Nyquist sampled sensor data; and
storing the received sensor data of the first sensor together with additional sensor data in the first database, wherein the additional sensor data is associated with the first classification;

wherein said detecting whether the event exists further comprises:
detecting the event based on the associated classification in the first database.

6. The computer-executable method of claim 1, further comprising:
receiving sensor data being sampled according to a second compressive sampling scheme by a second sensor from said plurality of sensors,
wherein the sampling time window of the first compressive sampling scheme is common to the sampling time window of the second compressive sampling;
wherein each compressive sampling scheme comprises one or more indices, each index defining a corresponding sampling time instant within a compressive sampling time window;
wherein each defined sampling time instant of the first compressive sampling scheme is different to each defined sampling time instant of the second compressive sampling scheme; and
storing the sensor data of the second sensor along with the stored sensor data of the first sensor in the first database;

wherein said detecting whether the event exists further comprises:
detecting the event using the sensor data of the second sensor in the first database.

7. A system for querying sensor data of a plurality of sensors, the sensor data comprising sensor data values sampled by a first sensor of said plurality of sensors according to a first compressive sampling scheme, the first compressive sampling scheme being applied by the first sensor within a sampling time window, the received sensor data corresponding to samples of a signal within the sampling time window, the system being adapted to:
store the sensor data in a first database;
compute a frequency decomposition of the signal based on a sparsifying transform associated with the first compressive sampling scheme and the received sensor data, wherein the frequency decomposition comprises one or more frequency components;
store the one or more frequency components in a second database;
receive a query from a client, the query specifying an event that indicates a critical signal condition of a signal; and
detect whether the event exists using the one or more frequency components.

* * * * *